United States Patent
Doi

(10) Patent No.: US 10,128,056 B2
(45) Date of Patent: Nov. 13, 2018

(54) DYE-SENSITIZED SOLAR CELL

(71) Applicant: FUJIKURA LTD., Koto-ku, Tokyo (JP)

(72) Inventor: Katsuhiro Doi, Chiba (JP)

(73) Assignee: FUJIKURA LTD., Koto-tu, Tokyo (JP)

( * ) Notice: Subject to any disclaimer, the term of this patent is extended or adjusted under 35 U.S.C. 154(b) by 0 days.

(21) Appl. No.: 13/764,490

(22) Filed: Feb. 11, 2013

(65) Prior Publication Data
US 2013/0153021 A1    Jun. 20, 2013

Related U.S. Application Data

(63) Continuation of application No. PCT/JP2011/073065, filed on Oct. 6, 2011.

(30) Foreign Application Priority Data

Oct. 6, 2010  (JP) .................. 2010-227055
Oct. 6, 2010  (JP) .................. 2010-227056

(Continued)

(51) Int. Cl.
*H01G 9/20*   (2006.01)
*H01L 31/048*   (2014.01)

(52) U.S. Cl.
CPC .......... *H01G 9/2077* (2013.01); *H01G 9/209* (2013.01); *H01G 9/2027* (2013.01);
(Continued)

(58) Field of Classification Search
CPC .... H01G 9/2077; H01G 9/2095; H01G 9/209; H01G 9/2027; H01G 9/2059; H01G 9/2031; H01L 31/048
(Continued)

(56) References Cited

U.S. PATENT DOCUMENTS 5,742,006 A      4/1998  Grupp et al.
2005/0109391 A1* 5/2005  Kobayashi .............. 136/263
(Continued)

FOREIGN PATENT DOCUMENTS

CN    1140339 A    1/1997
CN    101752437 A  6/2010
(Continued)

OTHER PUBLICATIONS

English machine translationinto of JP 2009-277399 Umebayashi et al.*

(Continued)

*Primary Examiner* — Edward J. Schmiedel
(74) *Attorney, Agent, or Firm* — Sughrue Mion, PLLC

(57) ABSTRACT

The present invention is a dye-sensitized solar cell that has a pair of electrodes that oppose each other, a sealing section that joins the pair of electrodes, an electrolyte that fills a cell space that is surrounded by the pair of electrodes and the sealing section, wherein the sealing section has a resin sealing section that contains a resin, the resin sealing section has a changing-thickness section, the thickness of which increases or decreases as a distance from the electrolyte is increased and which has an inclined face, and the resin sealing section comes into contact, along the inclined face of the changing-thickness section, with an electrode of the pair of electrodes that opposes the inclined face.

17 Claims, 17 Drawing Sheets

(30) Foreign Application Priority Data

Feb. 17, 2011 (JP) ................................. 2011-031674
Feb. 17, 2011 (JP) ................................. 2011-031675

(52) U.S. Cl.
CPC ......... *H01L 31/048* (2013.01); *H01G 9/2031* (2013.01); *H01G 9/2059* (2013.01); *Y02E 10/542* (2013.01)

(58) Field of Classification Search
USPC ........................................ 136/259, 251, 263
See application file for complete search history.

(56) References Cited

U.S. PATENT DOCUMENTS

| | | | |
|---|---|---|---|
| 2007/0224464 A1* | 9/2007 | Balasubramanian | ........................ H01M 14/005 136/243 |
| 2007/0284761 A1* | 12/2007 | Morooka et al. | ............. 257/792 |
| 2010/0147377 A1 | 6/2010 | Ishihara et al. | |
| 2011/0114166 A1* | 5/2011 | Chang et al. | ................. 136/256 |

FOREIGN PATENT DOCUMENTS

| JP | 2005-353295 A | 12/2005 |
|---|---|---|
| JP | 2006-004827 A | 1/2006 |
| JP | 2008-153180 A | 7/2008 |
| JP | 2009-266616 A | 11/2009 |
| JP | 2009-277399 A | 11/2009 |
| JP | 2009277399 A * | 11/2009 |
| JP | 2009-295406 A | 12/2009 |

OTHER PUBLICATIONS

English machine translation of JP 2009-266616 Miyajima et al.*
English machine translation of JP 2009-295406 Yuasa.*
Machine translation of JP 2009-277399; published Nov. 2009; accessed and printed Jun. 7, 2018 (Year: 2009).*
Office Action issued in corresponding Chinese Patent Application No. 201180018575.0 dated May 13, 2013.
Communication dated Sep. 29, 2017, from European Patent Office in counterpart application No. 11830728.9.

* cited by examiner

DYE-SENSITIZED SOLAR CELL

CROSS REFERENCE TO RELATED APPLICATIONS

This application is a Continuation of National Stage of International Application No. PCT/JP2011/073065 filed Oct. 6, 2011, claiming priority based on Japanese Patent Applications No. 2010-227055 filed Oct. 6, 2010, No. 2010-227056 filed Oct. 6, 2010, No. 2011-031674 filed Feb. 17, 2011 and No. 2011-031675 filed Feb. 17, 2011, the contents of all of which are incorporated herein by reference in their entirety.

TECHNICAL FIELD

The present invention relates to a dye-sensitized solar cell.

BACKGROUND ART

Dye-sensitized solar cells are attracting attention for use as photoelectric conversion elements since they allow the obtaining of high photoelectric conversion efficiency at low cost, and various studies have been conducted on the development of these dye-sensitized solar cells.

Ordinarily, a dye-sensitized solar cell comprises a working electrode having a porous oxide semiconductor layer, a counter electrode, a photosensitizing dye that is supported on the porous oxide semiconductor layer of the working electrode, a sealing section that joins the working electrode and the counter electrode, and an electrolyte that is disposed in a space (hereafter referred to as "cell space") surrounded by the working electrode, the counter electrode and the sealing section.

In such dye-sensitized solar cells, the sealing section is often made up of a resin, and the thickness of the sealing section is ordinarily constant (see for instance, Patent Documents 1 and 2 described below).

PRIOR ART DOCUMENTS

Patent Documents

Patent Document 1: Japanese Patent Application Publication No. 2008-153180
Patent Document 2: Japanese Patent Application Publication No. 2006-4827

SUMMARY OF THE INVENTION

Problems to be Solved by the Invention

However, the dye-sensitized solar cell disclosed in Patent Document 1 had still room for improvement in durability in cases where the dye-sensitized solar cell is used in high-temperature environments or high-humidity environments.

Namely, the electrolyte volatilizes and the pressure in the cell space rises when the dye-sensitized solar cell is used in a high-temperature environment. In such cases, if the thickness of the sealing section in the dye-sensitized solar cell disclosed in Patent Document 1 is large, the cross-sectional area of passage that the electrolyte passes becomes large, and hence there is a high likelihood of electrolyte leakage through the sealing section.

On the other hand, the thickness of the sealing section may be reduced in order to reduce the cross-sectional area of passage of the electrolyte in the sealing section. In such a case, however, the thickness of the entire sealing section becomes smaller, and hence the adhesive strength of the sealing section to the working electrode and the counter electrode becomes weaker. Consequently, this may give rise to delamination between the sealing section and the working electrode or the counter electrode, and to electrolyte leakage, upon a rise of pressure in the cell space when the dye-sensitized solar cell is used in a high-temperature environment.

In a case where the dye-sensitized solar cell disclosed in Patent Document 1 is used in a high-humidity environment, the cross-sectional area of passage of moisture through the sealing section increases, if the thickness of the sealing section is large. Intrusion of moisture into the electrolyte through the sealing section becomes likelier as a result, and photoelectric conversion efficiency may drop.

On the other hand, the thickness of the sealing section may be reduced in order to suppress intrusion of moisture in the sealing section. In such a case, however, the thickness of the entire sealing section becomes smaller, and hence the adhesive strength of the sealing section to the working electrode and the counter electrode becomes weaker. As a result, moisture is more likely to intrude through the interface between the sealing section and the working electrode or the counter electrode when the dye-sensitized solar cell is used in a high-humidity environment.

Accordingly, there was a demand for a dye-sensitized solar cell in which drop of photoelectric conversion efficiency and electrolyte leakage can be sufficiently suppressed, and sufficient durability can be secured, even when the dye-sensitized solar cell is used in a high-temperature environment or in a high-humidity environment.

In the light of the above, it is an object of the present invention to provide a dye-sensitized solar cell which can secure sufficient durability even when the dye-sensitized solar cell is used in a high-temperature environment or a high-humidity environment.

Means for Solving the Problems

In order to solve the above problem, the inventor of the present invention conducted diligent study focusing on the thickness of a resin sealing section that comprises a resin. A conceivable approach in order to solve the above problem was to adjust the thickness of the resin sealing section to a value that is not excessively large or excessively small. However, sufficient durability failed to be secured even so. Therefore, the present inventor speculated that the above problem might be solved by prescribing not a constant thickness of the resin sealing section, but a varying thickness depending on the position from the electrolyte in the resin sealing section. As a result of further diligent study, the present inventors found that the above problem can be solved effectively by the invention set forth below.

Namely, the present invention is a dye-sensitized solar cell that comprises a pair of electrodes that oppose each other; a sealing section that joins the pair of electrodes; and an electrolyte that fills a cell space that is surrounded by the pair of electrodes and the sealing section; wherein the sealing section has a resin sealing section that comprises a resin; the resin sealing section has a changing-thickness section, the thickness of which changes to increase or decrease as a distance from the electrolyte is increased and which has an inclined face, and the resin sealing section comes into contact, along the inclined face of the changing-thickness section, with an electrode of the pair of electrodes that opposes the inclined face.

According to this dye-sensitized solar cell, the resin sealing section has a changing-thickness section, the thickness of which changes to increase or decrease as a distance from the electrolyte is increased, and the resin sealing section comes into contact, along the inclined face of the changing-thickness section, with an electrode of the pair of electrodes that opposes the inclined face. Therefore, in a case where the thickness of the changing-thickness section increases as a distance from the electrolyte is increased, the electrolyte-side thickness of the changing-thickness section can be made sufficiently small, which allows reducing the cross-sectional area of passage of electrolyte. Leakage of the electrolyte can be suppressed as a result. On the other hand, if the thickness of the changing-thickness section increases as a distance from the electrolyte is increased, the adhesive strength of the resin sealing section to the electrode is sufficiently enhanced by the changing-thickness section. Accordingly, delamination of the resin sealing section off the electrode can be sufficiently suppressed, and electrolyte leakage can be sufficiently suppressed, even when excessive stress acts on the interface between the electrode and the changing-thickness section as the pressure in the cell space increases when the dye-sensitized solar cell of the present invention is used in a high-temperature environment. As a result, sufficient durability can be secured according to the dye-sensitized solar cell of the present invention, even when the dye-sensitized solar cell is used in a high-temperature environment.

In a case where the thickness of the changing-thickness section decreases as a distance from the electrolyte is increased, the thickness of the portion on side opposite to the electrolyte of the changing-thickness section is rendered sufficiently small, and hence the exposed surface area of the resin sealing section to the outer atmosphere can be made smaller. Therefore, intrusion of moisture can be sufficiently suppressed even when the dye-sensitized solar cell is used in a high-humidity environment. On the other hand, in a case where the thickness of the changing-thickness section decreases as distance from the electrolyte is increased, i.e. increases towards the electrolyte, the adhesive strength of the resin sealing section to the electrode can be sufficiently enhanced by the changing-thickness section. Therefore, drops in adhesive strength of the resin sealing section to the electrode can be sufficiently suppressed, and intrusion of moisture through the interface of the electrode and the resin sealing section can be sufficiently suppressed, even when the dye-sensitized solar cell of the present invention is used in a high-humidity environment. As a result, sufficient durability can be secured according to the dye-sensitized solar cell of the present invention, even when the dye-sensitized solar cell is used in a high-humidity environment.

The changing-thickness section is, for instance, an increasing-thickness section, the thickness of which increases as a distance from the electrolyte is increased.

The increasing-thickness section may be at least at part of the resin sealing section. Namely, the resin sealing section may have a portion, the thickness of which is constant and which is in contact with the electrolyte, or a decreasing-thickness section, the thickness of which decreases as a distance from the electrolyte is increased, closer to the electrolyte than the increasing-thickness section. In other words, the increasing-thickness section may be at any position within the resin sealing section. In that case, sufficient durability of the dye-sensitized solar cell can be secured, even when the dye-sensitized solar cell is used in a high-temperature environment. The reasons for this are as follows. Namely, if the resin sealing section has the increasing-thickness section, then, by virtue of the increasing-thickness section, the thickness of the resin sealing section on the electrolyte side of the increasing-thickness section becomes sufficiently small, the exposed surface area of the resin sealing section to the electrolyte can be further reduced, and electrolyte leakage can be sufficiently suppressed. Therefore, electrolyte leakage can be sufficiently suppressed even when the dye-sensitized solar cell is used in a high-temperature environment. On the other hand, the thickness of the increasing-thickness section increases as a distance from the electrolyte is increased. That is, there is a portion of large thickness on the side opposite to the electrolyte (side not readily reached by the electrolyte). In other words, thickness can be secured at a position where the influence of the electrolyte is small. Accordingly, the adhesive strength of the resin sealing sections to the electrode is sufficiently enhanced by the increasing-thickness section. Therefore, drops in the adhesive strength of the resin sealing section to the electrode can be sufficiently suppressed, even when the dye-sensitized solar cell is used in a high-temperature environment.

In the above dye-sensitized solar cell, preferably, the resin sealing section further has a decreasing-thickness section, the thickness of which decreases as a distance from the electrolyte is increased and which has an inclined face, on a side opposite to the electrolyte with respect to the increasing-thickness section, and the resin sealing section comes into contact, along the inclined face of the decreasing-thickness section, with an electrode, of the pair of electrodes, that opposes the inclined face.

In this case, the thickness of the decreasing-thickness section at the farthest position from the electrolyte can be made sufficiently small. That is, it becomes possible to reduce, in the decreasing-thickness section, the cross-sectional area of passage of oxygen or moisture that intrude from the exterior, at the farthest position from the electrolyte. Accordingly, intrusion of external oxygen or moisture can be sufficiently suppressed.

Preferably, the resin sealing section further has an increasing-thickness section, the thickness of which increases as a distance from the electrolyte is increased and which has an inclined face on a side opposite to the electrolyte with respect to the decreasing-thickness section, and the resin sealing section comes into contact, along the inclined face of the increasing-thickness section, with an electrode of the pair of electrodes that opposes the inclined face.

According to this dye-sensitized solar cell, the adhesive strength of the resin sealing section to the electrode is further enhanced by the increasing-thickness section that is provided on a side opposite to the electrolyte with respect to the decreasing-thickness section.

In the above dye-sensitized solar cell, preferably, the resin sealing section has a plurality of the increasing-thickness sections and a plurality of the decreasing-thickness sections; the increasing-thickness sections and the decreasing-thickness sections are arrayed alternately toward a direction away from the electrolyte, and an increasing-thickness section, of the increasing-thickness sections and the decreasing-thickness sections, is provided at a position closest to the electrolyte in the resin sealing section.

In this case, the sealing section has a plurality of increasing-thickness sections and a plurality of decreasing-thickness sections, and hence yet more sufficient durability can be secured. Further, the plurality of increasing-thickness sections and the plurality of decreasing-thickness sections allow for more sufficient restriction of the motion of the resin sealing section in the direction from the inner peripheral face towards the outer peripheral face thereof, even when stress acts on the resin sealing section, in that direction, as a result of increased internal pressure of the cell space when the dye-sensitized solar cell is used in a high-temperature environment. Also, the leakage cross-sectional area of the electrolyte can be reduced, and leakage of the electrolyte towards the exterior can be effectively suppressed, at the position closest to the electrolyte.

In the above dye-sensitized solar cell, preferably, the increasing-thickness section is in contact with the electrolyte.

In this case the increasing-thickness section is provided at a position, in contact with the electrolyte, which is the site of the resin sealing section onto which the greatest stress is exerted and at which delamination is likeliest upon a rise in internal pressure in the cell space when the dye-sensitized solar cell is used in a high-temperature environment. As a result, sufficient adhesive strength to the electrode can be secured in the resin sealing section, and delamination of the resin sealing section off the electrode can be suppressed yet more effectively. The increasing-thickness sections are in contact with the electrolyte, and hence it becomes possible to reduce the exposed surface area of the resin sealing section to the electrolyte and to reduce the leakage cross-sectional area of the electrolyte. Therefore, electrolyte leakage can be suppressed more sufficiently.

The changing-thickness section may be a decreasing-thickness section, the thickness of which decreases as a distance from the electrolyte is increased, for example.

The decreasing-thickness section may be at least at part of the resin sealing section. For instance, an increasing-thickness section, the thickness of which increases as a distance from the electrolyte is increased, may be provided on the outermost side of the resin sealing section. In other words, the decreasing-thickness section may be at any position within the resin sealing section. In that case, sufficient durability of the dye-sensitized solar cell can be secured, even when the dye-sensitized solar cell is used in a high-humidity environment. The reasons for this are as follows. Namely, if the resin sealing section has the decreasing-thickness section, then, by virtue of the decreasing-thickness section, the thickness of the decreasing-thickness section on the side opposite to the electrolyte becomes sufficiently small, the exposed surface area of the resin sealing section to the outer atmosphere can be further reduced, and intrusion of moisture or air can be sufficiently suppressed. Therefore, intrusion of moisture or air can be sufficiently suppressed even when the dye-sensitized solar cell is used in a high-humidity environment. On the other hand, the thickness of the decreasing-thickness sections decreases as a distance from the electrolyte is increased. That is, the thickness of the decreasing-thickness sections increases towards the electrolyte. Namely, there is a portion of large thickness on the electrolyte side (side not readily reached by the moisture or air). In other words, thickness can be secured at a position where the influence of moisture or air is small. Accordingly, the adhesive strength of the resin sealing sections to the electrode is sufficiently enhanced by the decreasing-thickness sections. Therefore, drops in the adhesive strength of the resin sealing section to the electrode can be sufficiently suppressed, even when the dye-sensitized solar cell is used in a high-humidity environment.

In the above dye-sensitized solar cell, preferably, the resin sealing section further has an increasing-thickness section, the thickness of which increases as a distance from the electrolyte is increased and which has an inclined face on a side opposite to the electrolyte with respect to the decreasing-thickness section, and the resin sealing section comes into contact, along the inclined face of the increasing-thickness section, with an electrode of the pair of electrodes that opposes the inclined face.

In this case, the thickness of the increasing-thickness section, on the electrolyte side, becomes sufficiently small. That is, the cross-sectional area of passage of electrolyte can be made narrower on the electrolyte side, in the increasing-thickness section. Therefore, electrolyte leakage can be sufficiently suppressed.

Preferably, the resin sealing section further has a decreasing-thickness section, the thickness of which decreases as a distance from the electrolyte is increased and which has an inclined face, on a side opposite to the electrolyte with respect to the increasing-thickness section, and the resin sealing section comes into contact, along the inclined face of the decreasing-thickness section, with an electrode of the pair of electrodes that opposes the inclined face.

According to the above dye-sensitized solar cell, the adhesive strength of the resin sealing section to the electrode is further enhanced by the decreasing-thickness section that is provided on a side opposite to the electrolyte with respect to the increasing-thickness section.

In the above dye-sensitized solar cell, preferably, a groove that extends so as to intersect with the direction away from the electrolyte is formed by a face of contact between the increasing-thickness section and the electrode, and a face of contact between the decreasing-thickness section and the electrode.

In the dye-sensitized solar cell, a groove is formed by the contact face between the increasing-thickness section and the electrode and the contact face between the decreasing-thickness section and the electrode. That is, the increasing-thickness section and the decreasing-thickness section wedge integrally into a respective groove. As a result, the motion of the resin sealing section in the direction from the inner peripheral face towards the outer peripheral face thereof is sufficiently restricted, even when stress acts on the resin sealing section, in that direction, as a result of increased internal pressure of the cell space when the dye-sensitized solar cell is used in a high-temperature environment. Thanks to the groove that is formed in the electrode, it becomes possible to further lengthen the passage channel of electrolyte that migrates from the cell space towards the exterior via the interface of the electrode and the resin sealing section and to lengthen the passage channel of oxygen or moisture that intrudes from the exterior and migrates towards the cell space. Further, when the electrolyte or moisture that intrude from the exterior passes through the groove, part of the electrolyte and of the external oxygen or moisture enters into the groove, and moves along the groove readily. Intrusion of oxygen or moisture into the cell space from the resin sealing section, and leakage of the electrolyte towards the exterior from the resin sealing section are sufficiently suppressed as a result. Stress acts also on the resin sealing section, in a direction from the outer peripheral face towards the inner peripheral face thereof, as a result of a drop in the internal pressure of the cell space in environments of accompanying a change in temperature, for instance decreasing temperature from evening to nighttime. The motion of the resin sealing section from the outer peripheral face towards the inner peripheral face thereof can be sufficiently restricted in such cases as well.

In the above dye-sensitized solar cell, preferably, a maximum thickness of the resin sealing section is 10 µm or greater.

In this case, the thickness of the resin sealing section can be sufficiently secured, and the adhesive strength of the resin sealing section to the electrode can be sufficiently secured, by virtue of the maximum thickness of the resin sealing section being 10 µm or greater. As a result, electrolyte leakage can be effectively suppressed.

Preferably, at least one electrode of the pair of electrodes has flexibility.

In this case, at least one electrode of the pair of electrodes can deflect, even when the internal pressure in the cell space rises when the dye-sensitized solar cell is used in a high-temperature environment. Stress acting on the interface between the resin sealing section and the electrode having flexibility can be relieved as a result.

In the above dye-sensitized solar cell, one electrode in the pair of electrodes may have a conductive substrate, and a porous oxide semiconductor layer provided on the conductive substrate; a surface of the conductive substrate on the porous oxide semiconductor layer side may be a flat surface, and a face of contact between the increasing-thickness section and the other one of the pair of electrodes may be tilted with respect to the flat surface.

The above dye-sensitized solar cell, preferably, further comprising a cover section that covers at least a boundary between the sealing section and the pair of electrodes on a side opposite to the electrolyte with respect to the sealing section; and the cover section contains a resin.

In this case, leakage of the electrolyte or intrusion of external oxygen or moisture into the electrolyte is suppressed not only by the sealing section, but also by the cover section. In particular, the cover section effectively suppresses leakage of electrolyte or intrusion of external oxygen or moisture into the electrolyte, through the interface between the sealing section and one of the electrodes, and the interface between the sealing section and the other electrode.

The present invention may be a dye-sensitized solar cell that comprises a pair of electrodes that oppose each other; a sealing section that joins the pair of electrodes; and an electrolyte that fills a cell space that is surrounded by the pair of electrodes and the sealing section; wherein the sealing section has a resin sealing section that comprises a resin, and the resin sealing section has an increasing-thickness section which is in contact with at least one electrode of the pair of electrodes, and in which the thickness increases as a distance from the electrolyte is increased.

The present invention may be a dye-sensitized solar cell that comprises a pair of electrodes that oppose each other; a sealing section that joins the pair of electrodes; and an electrolyte that fills a cell space that is surrounded by the pair of electrodes and the sealing section; wherein the sealing section has a resin sealing section that contains a resin, and the resin sealing section has a decreasing-thickness section which is in contact with at least one electrode of the pair of electrodes, and in which the thickness decreases as a distance from the electrolyte is increased.

In the present invention, an electrode having "flexibility" means that a maximum deformation rate of electrode deflection exceeds 20% when a weight load of 20 g is applied onto the center of the electrode, in a state where both edges (each 5 mm wide) of the long sides of a 50 mm×200 mm sheet-like electrode are fixed horizontally with a tension of 1 N, in an environment at 20° C. The maximum deformation rate is the value calculated on the basis of the expression below:

Maximum deformation rate (%)=100×(maximum displacement/thickness of sheet-like electrode).

For instance, the maximum deformation rate is 25% in a case where a 0.04 mm-thick sheet-like electrode deflects with a maximum displacement of 0.01 mm when acted upon by a load as described above. In such a case, the sheet-like electrode "has flexibility".

Effect of the Invention

According to the present invention, a dye-sensitized solar cell which can secure sufficient durability, even when the dye-sensitized solar cell is used in a high-temperature environment or a high-humidity environment is provided.

MODES FOR CARRYING OUT THE INVENTION

Embodiments of the present invention are explained next with reference to accompanying drawings.

First Embodiment

Figure 1:
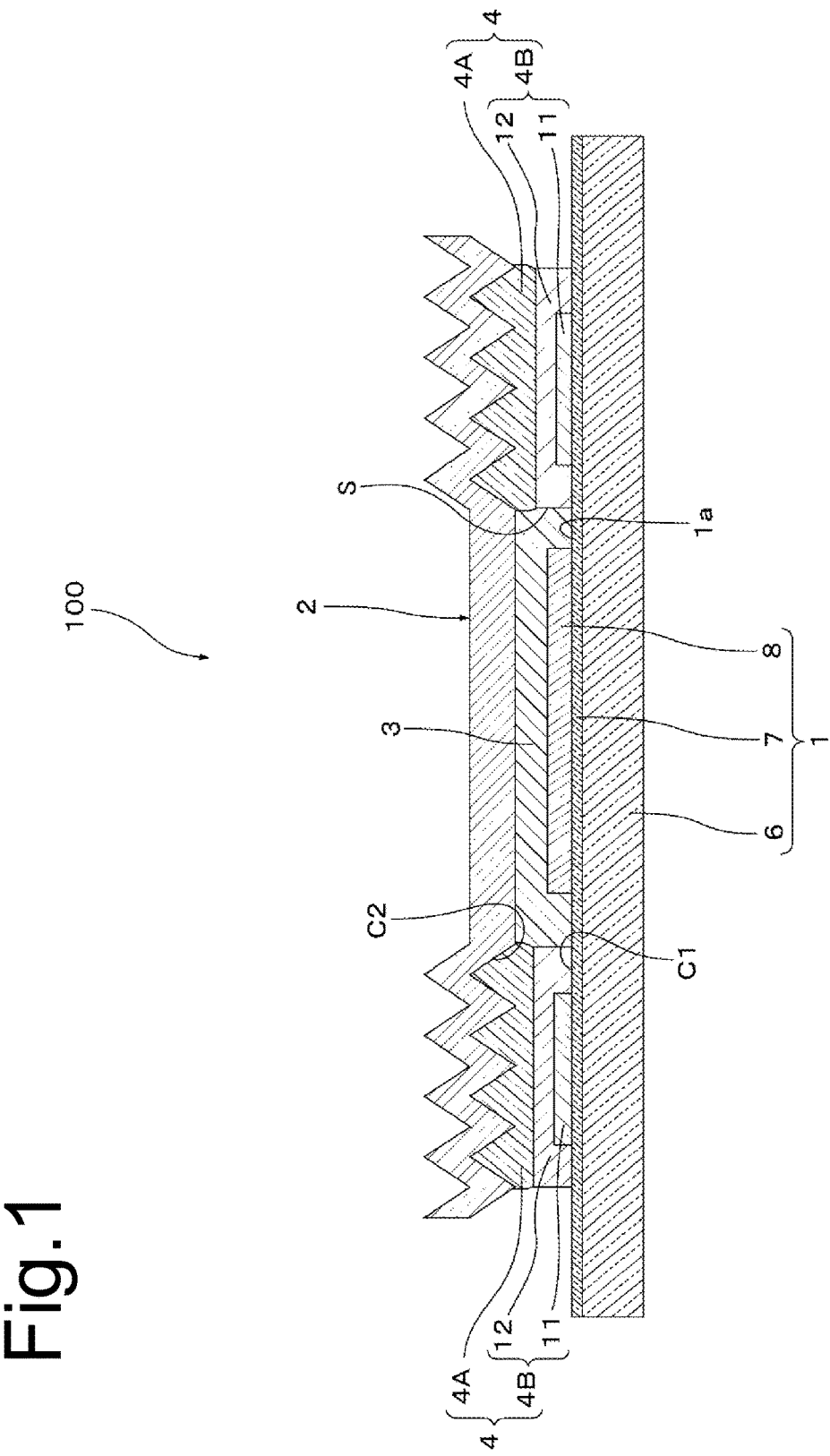
FIG. 1 is a cross-sectional diagram illustrating a first embodiment of a dye-sensitized solar cell of the present invention.
Figure 2:
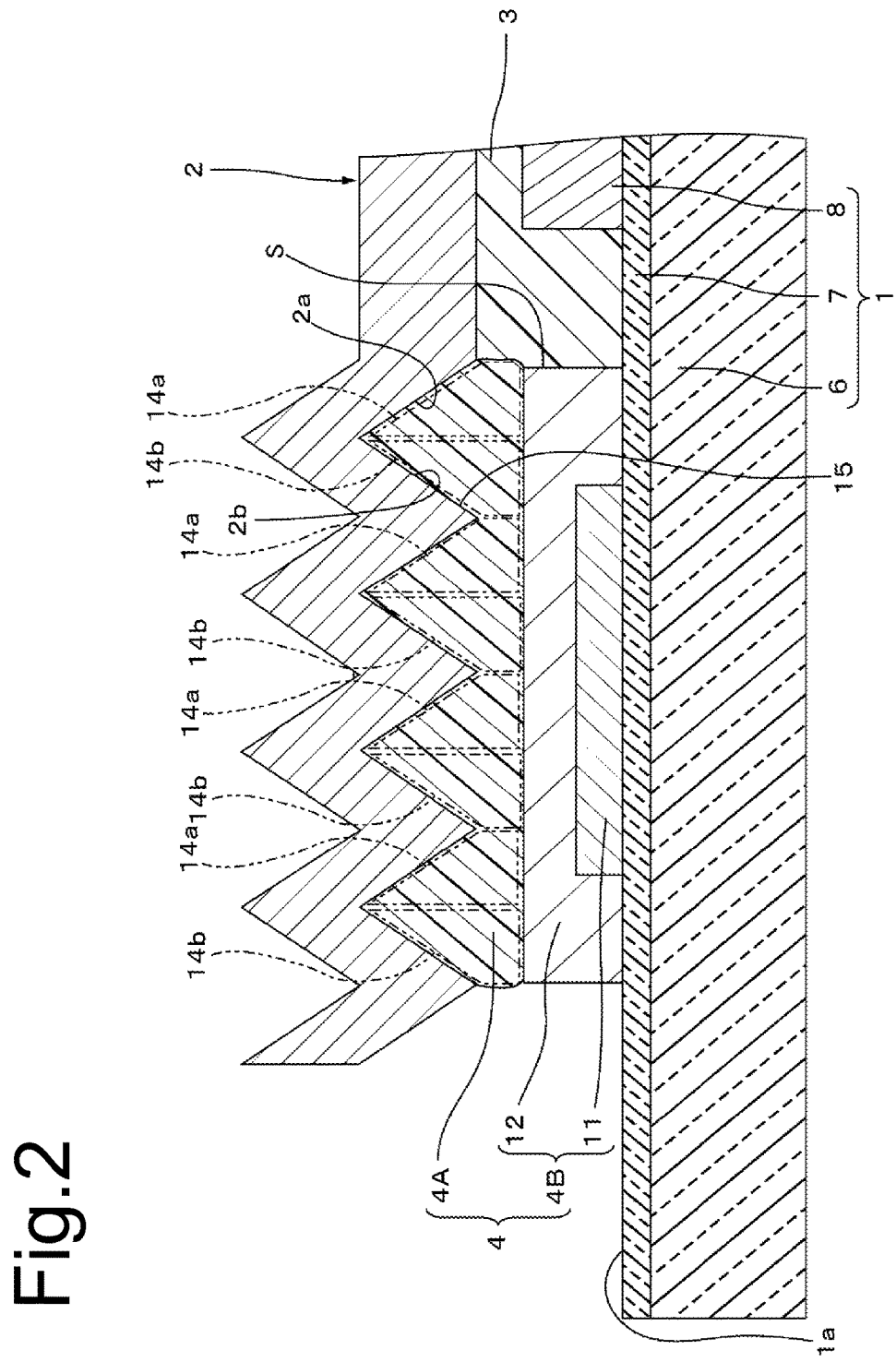
FIG. 2 is a partial enlarged diagram of FIG. 1.
Figure 3:
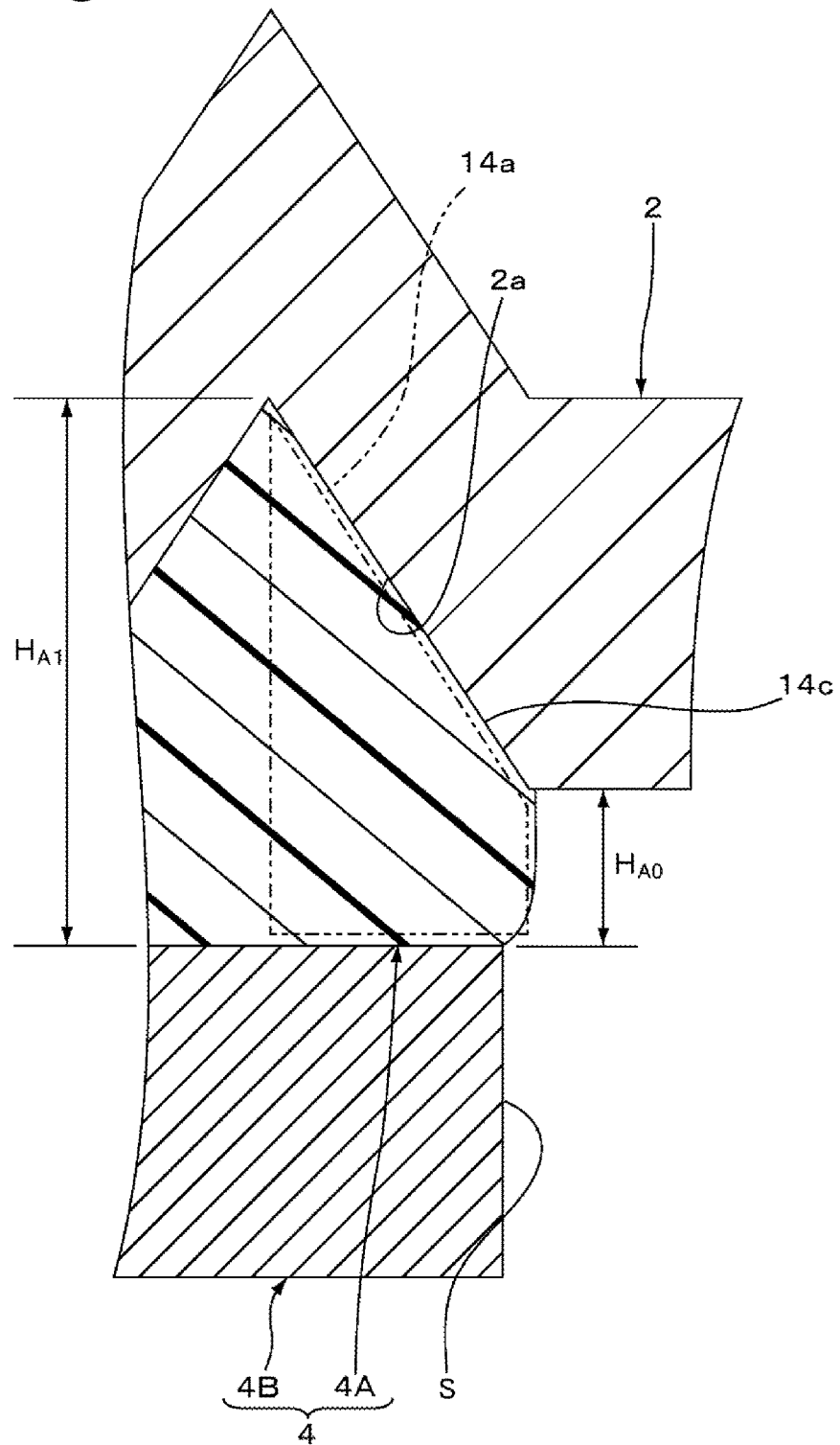
FIG. 3 is a partial enlarged diagram illustrating an increasing-thickness section of FIG. 2.
Figure 4:
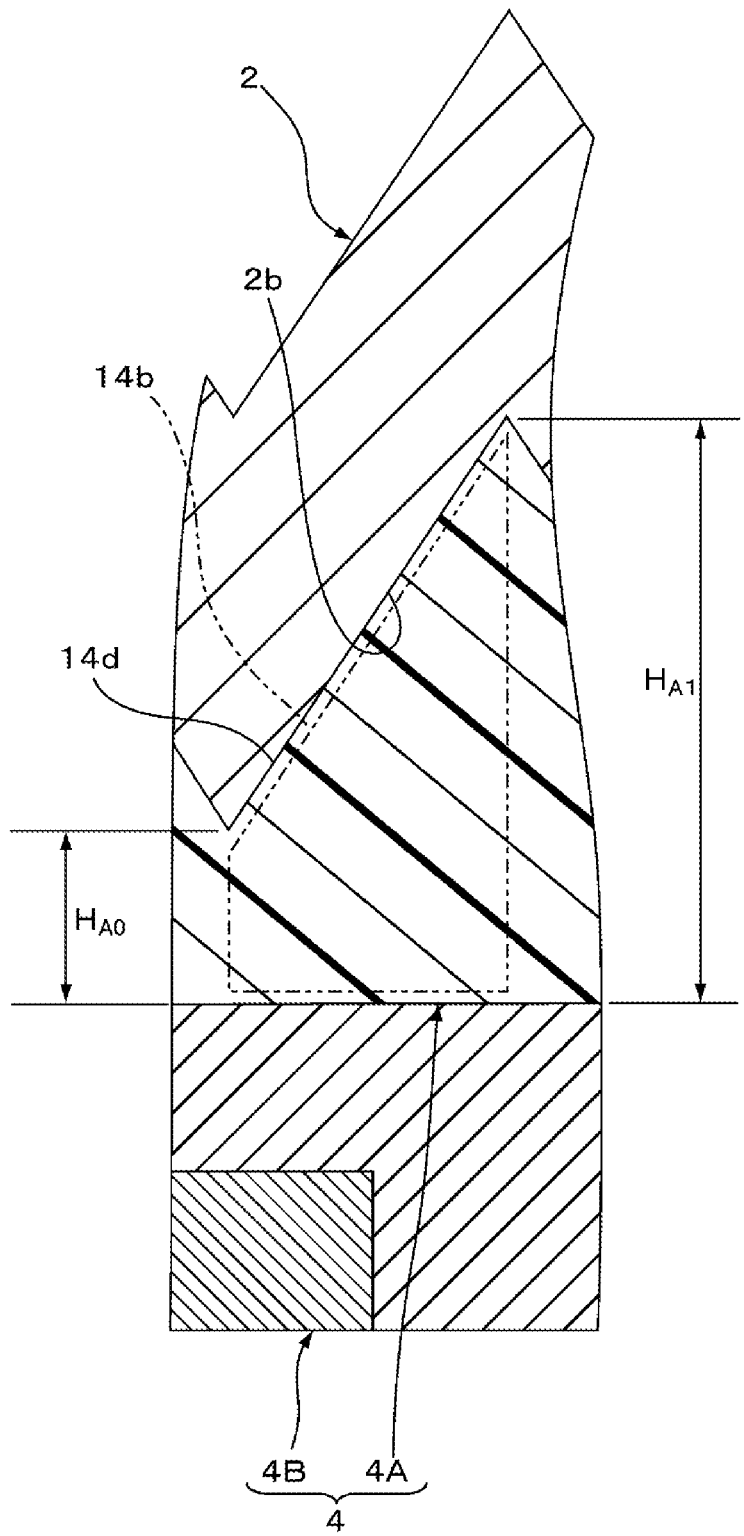
FIG. 4 is a partial enlarged diagram illustrating a decreasing-thickness section of FIG. 2.

A first embodiment of the dye-sensitized solar cell according to the present invention will be explained first with reference to FIG. 1 to FIG. 4. FIG. 1 is a cross-sectional diagram illustrating a first embodiment of the dye-sensitized solar cell according to the present invention; FIG. 2 is a partial enlarged diagram of FIG. 1; FIG. 3 is a partial enlarged diagram illustrating an increasing-thickness section of FIG. 2; and FIG. 4 is a partial enlarged diagram illustrating a decreasing-thickness section of FIG. 2.

As illustrated in FIG. 1 and FIG. 2, a dye-sensitized solar cell 100 comprises a working electrode 1 and a counter electrode 2 disposed so as to oppose the working electrode 1. The working electrode 1 and the counter electrode 2 are joined by a sealing section 4. The interior of a cell space S that is surrounded by the working electrode 1, the counter electrode 2 and the sealing section 4, is filled with an electrolyte 3.

The working electrode 1 comprises a transparent substrate 6, a transparent conductive film 7 that is provided on the counter electrode 2 side of the transparent substrate 6, and a porous oxide semiconductor layer 8 that is provided on the transparent conductive film 7. The sealing section 4 is bonded to a surface 1a of the transparent conductive film 7. The surface 1a of the transparent conductive film 7 may have irregularities of a size comparable to that of the crystals of the materials that make up the transparent conductive film 7 (about 1 μm), or may have no such irregularities. Hereafter, a surface 1a that has no irregularities of a size comparable to or greater than that of e crystals will be referred to as a flat surface.

Figure 5:
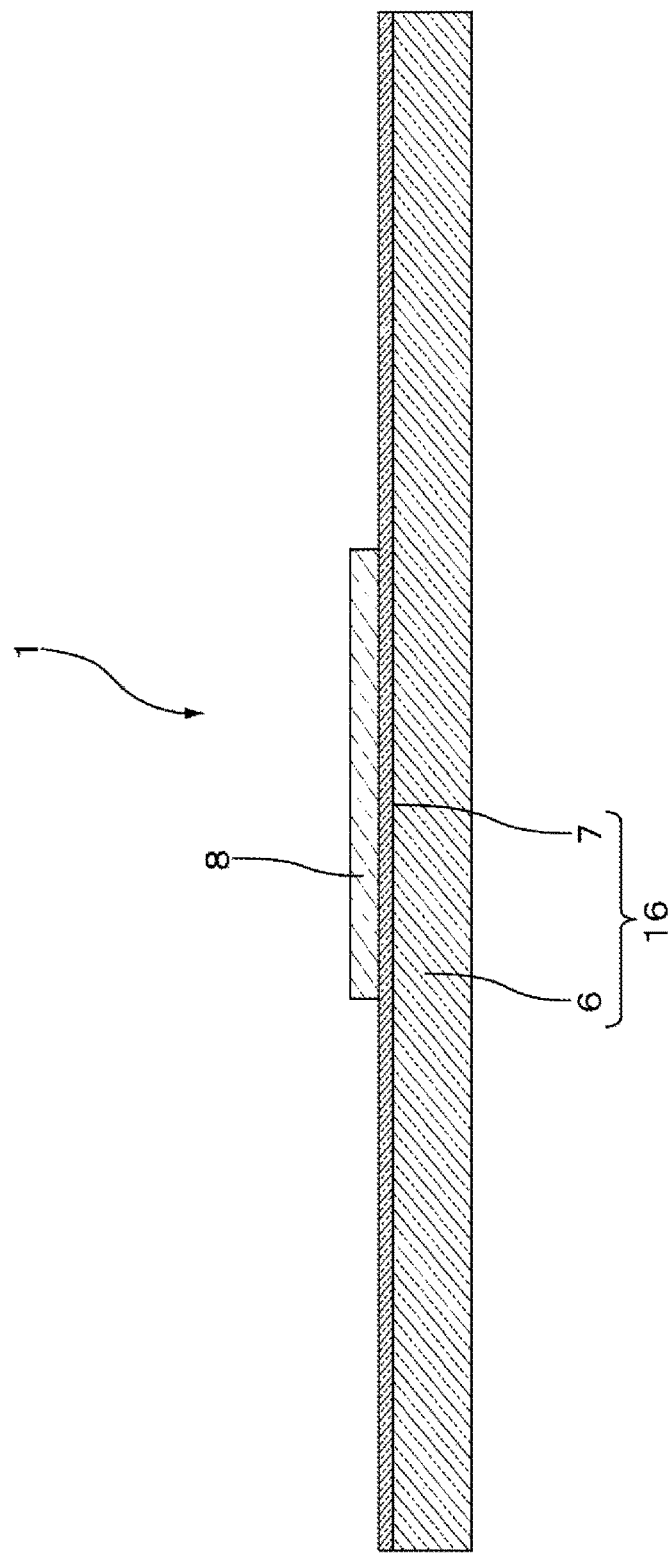
FIG. 5 is a cross-sectional diagram illustrating a working electrode of FIG. 1.

A photosensitizing dye is supported on the porous oxide semiconductor layer 8 of the working electrode 1. In the dye-sensitized solar cell 100, a conductive substrate 16 is made up of the transparent substrate 6 and the transparent conductive film 7 (FIG. 5).

The counter electrode 2 comprises a counter electrode substrate and a conductive catalyst layer (catalyst film) that is provided on the working electrode 1 side of the counter electrode substrate and that promotes reduction reactions at the surface of the counter electrode 2. The counter electrode 2 has flexibility.

The sealing section 4 is made up of a resin sealing section 4A that is bonded to the counter electrode 2, and an inorganic sealing section 4B that joins the resin sealing section 4A and the working electrode 1. The resin sealing section 4A is bonded to the counter electrode 2 at a second annular site C2 of the counter electrode 2, and the inorganic sealing section 4B is bonded to a first annular site C1 of the working electrode 1. The inorganic sealing section 4B comprises a collector wiring 11 that is fixed onto the transparent conductive film 7, and a wiring protective layer 12 that covers the collector wiring 11 and protects the collector wiring 11.

The resin sealing section 4A has a plurality (for instance, four) of annular increasing-thickness sections 14a the thickness whereof increases as a distance from the electrolyte 3 is increased, and a plurality (for instance, four) of annular decreasing-thickness sections 14b, the thickness whereof decreases as a distance from the electrolyte 3 is increased, and which are respectively provided on a side opposite to the electrolyte 3 with respect to each of the plurality of increasing-thickness sections 14a. That is, the resin sealing section 4A has a decreasing-thickness section 14b on the outermost side, and an increasing-thickness section 14a at the innermost side, so that the increasing-thickness section 14a comes into contact with the electrolyte 3. The increasing-thickness sections 14a and the decreasing-thickness sections 14b are denoted in FIG. 2 to FIG. 4 with two-dot chain lines.

The thickness of the increasing-thickness sections 14a is $H_{A0}$ at the electrolyte 3 side, as illustrated in FIG. 3. Herein, $H_{A0}$ is the minimum thickness of the increasing-thickness sections 14a. The thickness of each increasing-thickness section 14a increases as a distance from the electrolyte 3 is increased, and is $H_{A1}$ at the farthest distance from the electrolyte 3. Herein, $H_{A1}$ is the maximum thickness of the increasing-thickness sections 14a.

On the other hand, the thickness of the decreasing-thickness sections 14b is $H_{A1}$ at the electrolyte 3 side, as illustrated in FIG. 4. Herein, $H_{A1}$ is the maximum thickness of the decreasing-thickness sections 14b. The thickness of the decreasing-thickness section 14b decreases as a distance from the electrolyte 3 is increased, and is $H_{A0}$ at the farthest distance from the electrolyte 3. Herein, $H_{A0}$ is the minimum thickness of the decreasing-thickness sections 14b.

The plurality of annular increasing-thickness sections 14a and the plurality of annular decreasing-thickness sections 14b are formed continuously along the sealing section 4, and are arrayed alternately in the direction away from the electrolyte 3. Herein, the section on the innermost side of the resin sealing section 4A is an increasing-thickness section 14a, and the section on the outermost side is a decreasing-thickness section 14b. The increasing-thickness section 14a at the innermost side is in contact with the electrolyte 3.

In the dye-sensitized solar cell 100, the thickness of the increasing-thickness sections 14a increases proportionally to increasing distance from the electrolyte 3. That is, inclined faces 14c of the increasing-thickness sections 14a are flat surfaces. The resin sealing section 4A comes into contact with increasing-thickness section opposing contact faces 2a of the counter electrode 2 along the inclined faces 14c of the increasing-thickness sections 14a. Accordingly, the increasing-thickness section opposing contact faces 2a as well are flat surfaces. The thickness of the decreasing-thickness sections 14b decreases proportionally to increasing distance from the electrolyte 3. That is, inclined faces 14d of the decreasing-thickness sections 14b are flat surfaces. The resin sealing section 4A comes into contact with decreasing-thickness section opposing contact faces 2b of the counter electrode 2 along the inclined faces 14d of the decreasing-thickness sections 14b. Accordingly, the decreasing-thickness section opposing contact faces 2b as well are flat surfaces.

The thickness of the increasing-thickness sections 14a and the decreasing-thickness sections 14b change as described above, and the resin sealing section 4A has the plurality of increasing-thickness sections 14a and the plurality of decreasing-thickness sections 14b. Therefore, a plurality of annular protrusions is arrayed, toward the direction away from the electrolyte 3, on the surface of the resin sealing section 4A on the counter electrode 2 side, the annular protrusions being formed so as to intersect with the direction away from the electrolyte 3. As a result, the second annular site C2 of the counter electrode 2 has a complementary shape corresponding to the plurality of protrusions. That is, a plurality of annular grooves 15 is arrayed toward the direction away from the electrolyte 3, at the second annular site C2 of the counter electrode 2, the annular grooves 15 being formed so as to intersect with the direction away from the electrolyte 3. In other words, the annular grooves 15 extend each along the annular increasing-thickness sections 14a at the second annular site C2 of the counter electrode 2.

the increasing-thickness sections 14a and the decreasing-thickness sections 14b prescribe only the increase and decrease in their thickness. In a case where there are a plurality of the increasing-thickness sections 14a and a plurality of decreasing-thickness sections 14b, the shapes among the plurality of increasing-thickness sections 14a, and the shapes among the decreasing-thickness sections 14b need not necessarily be identical to each other.

Herein, the annular grooves 15 are formed by the increasing-thickness section opposing contact faces 2a, of the counter electrode 2, that opposes and come into contact with the increasing-thickness sections 14a, and by the decreasing-thickness section opposing contact faces 2b, of the counter electrode 2, that opposes and come into contact with the decreasing-thickness sections 14b. The increasing-thickness section opposing contact faces 2a are tilted, with respect to the flat surface 1a of the working electrode 1, in such a manner that the thickness of the resin sealing section 4A increases as a distance from the electrolyte 3 is increased. The decreasing-thickness section opposing contact faces 2b are tilted, with respect to the flat surface 1a of the working electrode 1, so as to decrease the thickness of the resin sealing section 4A.

According to the above-mentioned dye-sensitized solar cell 100, the resin sealing section 4A has increasing-thickness sections 14a the thickness whereof increases as distance from the electrolyte 3 is increased, and the resin sealing section 4A comes into contact, along the inclined faces 14c of the increasing-thickness sections 14a, with the counter electrode 2 that opposes the inclined faces 14c. Accordingly, the cross-sectional area of passage of the electrolyte 3 can be reduced as a result of sufficient reduction in the thickness of the increasing-thickness sections 14a, on the electrolyte 3 side. Leakage of the electrolyte 3 can be suppressed as a result. In the dye-sensitized solar cell 100, the sealing section 4 is made up of the resin sealing section 4A and the inorganic sealing section 4B that has a higher sealing ability than the resin sealing section 4A. Therefore, leakage of the electrolyte 3 can be suppressed more fully as compared with the case where the inorganic sealing section 4B is replaced by a resin sealing section in the resin sealing section 4. On the other hand, the thickness of the increasing-thickness sections 14a increases as a distance from the electrolyte 3 is increased. Therefore, the adhesive strength of the resin sealing section 4A to the counter electrode 2 is enhanced by the increasing-thickness sections 14a. Accordingly, delamination of the resin sealing section 4A off the counter electrode 2 can be sufficiently suppressed, and leakage of the electrolyte 3 can be sufficiently suppressed, even when excessive stress acts on the interface between the counter electrode 2 and the increasing-thickness sections 14a when the dye-sensitized solar cell 100 is used in a high-temperature environment and the pressure in the cell space S increases. Accordingly, it becomes possible to secure sufficient durability of the dye-sensitized solar cell 100, even when the cell is used in a high-humidity environment.

In particular, in the dye-sensitized solar cell 100 an increasing-thickness section 14a is provided at the innermost side of the resin sealing section 4A, and the increasing-thickness section 14a is in contact with the electrolyte 3. That is, the increasing-thickness sections 14a are provided at a position, in contact with the electrolyte 3, which is the site of the resin sealing section 4A onto which the greatest stress is exerted and at which delamination is likeliest upon a rise in internal pressure in the cell space S when the dye-sensitized solar cell 100 is used in a high-temperature environment. As a result, sufficient adhesive strength to the counter electrode 2 can be secured in the resin sealing section 4A, and delamination of the resin sealing section 4A off the counter electrode 2 can be suppressed more effectively than in a case where an increasing-thickness section 14a is not in contact with the electrolyte 3. Moreover, an increasing-thickness section 14a is in contact with the electrolyte 3. Therefore, it becomes possible to reduce the exposed surface area of the resin sealing section 4A to the electrolyte 3, at the position closest to the electrolyte 3 and to reduce the leakage cross-sectional area of the electrolyte 3. Therefore, leakage of the electrolyte 3 to the exterior can be suppressed more sufficiently.

Further, in the dye-sensitized solar cell 100, the resin sealing section 4A further has the decreasing-thickness sections 14b the thickness whereof decreases as a distance from the electrolyte 3 is increased, on a side opposite to the electrolyte 3 with respect to respective increasing-thickness sections 14a, and the resin sealing section 4A comes into contact, along the inclined faces 14d of the decreasing-thickness sections 14b, with the counter electrode 2 that opposes the inclined faces 14d. As a result, the thickness of the decreasing-thickness sections 14b on a side opposite to the electrolyte 3 can be made sufficiently small, and hence the exposed surface area of the resin sealing section 4A to the outer atmosphere can be reduced further. In other words, the thickness of the decreasing-thickness sections 14b at the farthest position from the electrolyte 3 can be made sufficiently small. That is, it becomes possible to reduce the cross-sectional area of passage of oxygen or moisture that intrudes from the exterior, at the farthest position from the electrolyte 3. Accordingly, intrusion of external oxygen or moisture from the exterior can be sufficiently suppressed even when the dye-sensitized solar cell 100 is used in a high-humidity environment.

On the other hand, the thickness of the decreasing-thickness sections 14b decreases as a distance from the electrolyte 3 is increased. That is, the thickness of the decreasing-thickness sections 14b increases towards the electrolyte 3. As a result, the adhesive strength of the resin sealing section 4A to the counter electrode 2 is sufficiently enhanced by the decreasing-thickness sections 14b. Accordingly, drops in adhesive strength of the resin sealing section 4A to the counter electrode 2 can be sufficiently suppressed, and intrusion of moisture through the interface of the counter electrode 2 and the resin sealing section 4A can be sufficiently suppressed, even when the dye-sensitized solar cell 100 is used in a high-humidity environment. Accordingly, it becomes possible to secure sufficient durability of the dye-sensitized solar cell 100, even when the cell is used in a high-humidity environment.

In the resin sealing section 4A of the dye-sensitized solar cell 100, in particular, the plurality of annular increasing-thickness sections 14a and the plurality of annular decreasing-thickness sections 14b are arrayed alternately, toward the direction of approaching the electrolyte 3, in such a manner that a decreasing-thickness section 14b is disposed on the outermost side of the resin sealing section 4A. Accordingly, intrusion of external oxygen or moisture can be suppressed more sufficiently than in a case where a decreasing-thickness section 14b is not provided at the outermost side of the resin sealing section 4A. In other words, the thickness of the resin sealing section 4A can be made smaller, and the exposed surface area of the resin sealing section 4A to the outer atmosphere can be made smaller, than in a case where an increasing-thickness section 14a is disposed on the outermost side of the resin sealing section 4A. Accordingly, intrusion of external oxygen or moisture can be suppressed more sufficiently, and more sufficient durability can be secured in the dye-sensitized solar cell 100, even when the cell is used in a high-humidity environment.

In the dye-sensitized solar cell 100, the annular grooves 15 are formed by the increasing-thickness section opposing contact faces 2a of the counter electrode 2 and by the decreasing-thickness section opposing contact faces 2b of the counter electrode 2. That is, the increasing-thickness sections 14a and the decreasing-thickness sections 14b wedge integrally into respective annular grooves 15. As a result, it becomes possible to sufficiently restrict the motion of the resin sealing section 4A in the direction from the inner peripheral face towards the outer peripheral face thereof, even when stress acts on the resin sealing section 4A, from the inner peripheral face towards the outer peripheral face thereof, as a result of increased internal pressure of the cell space S when the dye-sensitized solar cell 100 is used in a high-temperature environment. Stress acts also on the resin sealing section 4A, in a direction from the outer peripheral face towards the inner peripheral face thereof, as a result of a drop in the internal pressure of the cell space S in environments of accompanying a change in temperature, for instance decreasing temperature from evening to nighttime. The motion of the resin sealing section 4A from the outer peripheral face towards the inner peripheral face thereof can be sufficiently restricted in such cases as well.

Thanks to the annular grooves 15 being formed in the counter electrode 2, it becomes possible to further lengthen the passage channel of electrolyte 3 that migrates from the cell space S towards the exterior through the interface between the counter electrode 2 and the resin sealing section 4A, and to lengthen the passage channel of oxygen or moisture that intrude from the exterior, via the interface between the counter electrode 2 and the resin sealing section 4A. Further, when the electrolyte 3 or external oxygen or moisture passes through the annular grooves 15, part of the electrolyte 3 or of the external oxygen or moisture enters into the annular grooves 15, and moves along the annular grooves 15 readily. Intrusion of oxygen or moisture into the cell space S from the sealing section 4, as well as leakage of the electrolyte S towards the exterior from the sealing section 4, are sufficiently suppressed as a result. In particular, external moisture is readily trapped by the annular grooves 15, and the trapped moisture moves readily along the annular grooves 15. Therefore, the amount of moisture that moves towards the electrolyte 3 can be sufficiently reduced. Moreover, in the dye-sensitized solar cell 100, it is the annular grooves 15 formed continuously that is formed on the surface of the counter electrode 2. When trapped at the annular grooves 15, therefore, the moisture moves along the annular grooves 15. The trapped moisture can be confined as a result within the annular grooves 15.

In the present embodiment, the counter electrode 2 has flexibility. As a result, the counter electrode 2 deflects also upon a rise in the internal pressure in the cell space S when the dye-sensitized solar cell 100 is used in a high-temperature environment. Stress acting on the interface between the resin sealing section 4A and the counter electrode 2 having flexibility can be relieved as a result.

In the dye-sensitized solar cell 100, the maximum thickness of the resin sealing section 4A, i.e. $H_{A1}$, is not particularly limited, but is preferably 10 μm or greater, more preferably 20 μm or greater, and yet more preferably 30 μm or greater. The thickness of the resin sealing section 4A is sufficiently secured, and the adhesive strength of the resin sealing section 4A to the counter electrode 2 is sufficiently secured, if the maximum thickness of the resin sealing section 4A is 10 μm or greater. As a result, leakage of the electrolyte 3 can be effectively suppressed, and the durability of the dye-sensitized solar cell 100 can be enhanced more sufficiently.

Preferably, the maximum thickness of the resin sealing section 4A is no greater than 1000 μm, since in that case the cross-sectional area of permeation of the electrolyte 3 is small.

The difference between the maximum value and the minimum value of the thickness of the resin sealing section 4A, i.e. $(H_{A1}-H_{A0})$ may be any value greater than 0, but ranges preferably from 1 to 95 μm, more preferably from 5 to 90 μm.

The durability of the dye-sensitized solar cell 100 can be further enhanced in this case, as compared with a case where the $(H_{A1}-H_{A0})$ deviates from the above ranges.

A method for manufacturing the dye-sensitized solar cell 100 is explained next with reference to FIG. 5 to FIG. 13.

[Preparation Step]

The working electrode 1 and the counter electrode 2 are prepared first.

(Working Electrode)

The working electrode 1 is obtained as described below (FIG. 5).

The conductive substrate 16, which is a stack, is formed first by forming the transparent conductive film 7 on the transparent substrate 6. The method used for forming the transparent conductive film 7 may be, for instance, sputtering, vapor deposition, spray pyrolysis deposition (SPD), CVD or the like.

The material that makes up the transparent substrate 6 may be, for instance, a transparent material. Examples of such transparent material include, for instance, glass such as borosilicate glass, soda lime glass, glass which is made of soda lime and whose iron component is less than that of ordinary soda lime glass or quartz glass, quartz glass or the like, or polyethylene terephthalate (PET), polyethylene naphthalate (PEN), polycarbonate (PC), a polyether sulfone (PES) or the like. The thickness of the transparent substrate 6 is appropriately set in accordance with the size of the dye-sensitized solar cell 100, and is not particularly limited, but may range, for instance, from 50 to 10000 μm.

Examples of the material that makes up the transparent conductive film 7 include, for instance, conductive metal oxides such as tin-doped indium oxide (indium-tin-oxide: ITO), tin oxide ($SnO_2$), fluorine-doped-tin-oxide (FTO) or the like. The transparent conductive film 7 may be a single layer or a stack of a plurality of layers that are made up of respectively dissimilar conductive metal oxides. In a case where the transparent conductive film 7 is a single layer, the transparent conductive film 7 is preferably made of FTO, on account of the high heat resistance and chemical resistance of FTO. Preferably, a stack comprising a plurality of layers is used as the transparent conductive film 7, since in that case it is possible to reflect the characteristics of the respective layers. Among such stacks there is preferably used a stack of a layer made of ITO and a layer made of FTO. In this case there can be realized a transparent conductive film 7 that has high conductivity, heat resistance and chemical resistance.

The thickness of the transparent conductive film 7 may be set to range from 0.01 to 2 μm.

A paste for forming a porous oxide semiconductor layer is printed on the transparent conductive film 7 obtained as described above. The paste for forming a porous oxide semiconductor layer comprises oxide semiconductor particles, and, in addition, a resin such as polyethylene glycol, and a solvent such as terpineol. Examples of oxide semiconductor particles include, for instance, titanium oxide ($TiO_2$), zinc oxide (ZnO), tungsten oxide ($WO_3$), niobium oxide ($Nb_2O_5$), strontium titanate ($SrTiO_3$), tin oxide ($SnO_2$), indium oxide ($In_3O_3$), zirconium oxide ($ZrO_2$), thallium oxide ($Ta_2O_5$), lanthanum oxide ($La_2O_3$), yttrium oxide ($Y_2O_3$), holmium oxide ($Ho_2O_3$), bismuth oxide ($Bi_2O_3$), cerium oxide ($CeO_2$) and aluminum oxide ($Al_2O_3$). These oxides can be used singly or in combinations of two or more types. The method used for printing the paste for forming a porous oxide semiconductor layer may be, for instance, screen printing, printing using a doctoring blade, bar coating or the like.

The porous oxide semiconductor layer 8 is formed next on the transparent conductive film 7 through firing of the paste for forming a porous oxide semiconductor layer. The firing temperature varies depending on the oxide semiconductor particles, but ranges ordinarily from 350 to 600° C. Likewise, the firing time varies depending on the oxide semiconductor particles, but ranges ordinarily from 1 to 5 hours.

The porous oxide semiconductor layer 8 is made up of the porous oxide semiconductor. The porous oxide semiconductor is made up of, for instance, the above-described oxide semiconductor particles. Preferably, the average particle size of the oxide semiconductor particles ranges from 1 to 1000 nm, since in that case the surface area of the oxide semiconductor covered by a dye is greater, i.e. the site in which photoelectric conversion takes place is wider, and more electrons can be generated. Preferably, the porous oxide semiconductor layer 8 is constituted by a stack resulting from stacking oxide semiconductor particles having dissimilar particle size distributions. In such a case, repeated light reflection can occur within the stack, and light can be converted to electrons with good efficiency, with no incident light escaping out of the stack. The thickness of the porous oxide semiconductor layer 8 may be set to range, for instance, from 0.5 to 50 μm. The porous oxide semiconductor layer 8 may be configured in the form of a stack of a plurality of semiconductor layers that comprise dissimilar materials.

(Counterelectrode)

Figure 6:
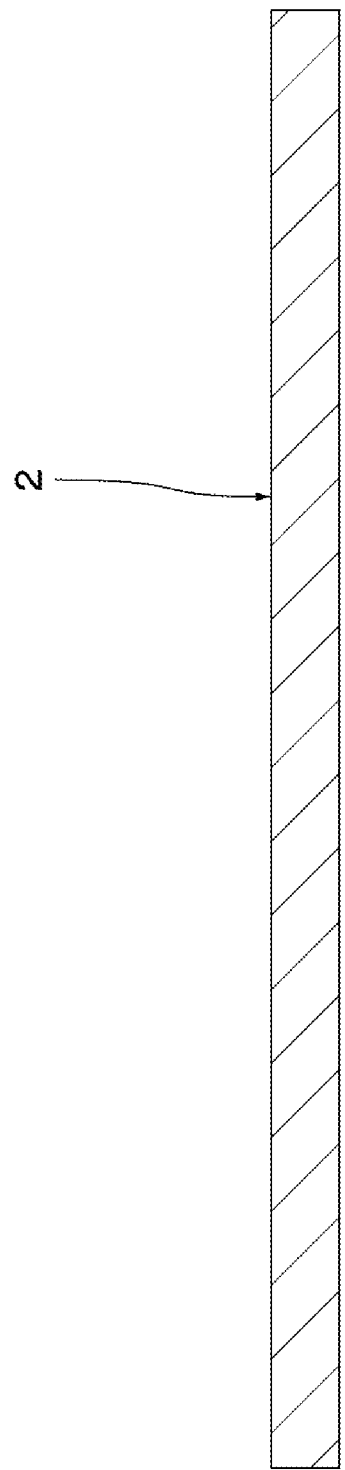
FIG. 6 is a cross-sectional diagram illustrating a counter electrode of FIG. 1.

The counter electrode 2 can be obtained as described below (FIG. 6).

The counter electrode substrate is prepared first. A catalyst layer is formed then on the counter electrode substrate. The method used for forming the catalyst layer may be, for instance, sputtering, vapor deposition or the like. Sputtering is preferred among the foregoing in terms of film uniformity.

As the counter electrode substrate there can be used, for instance, a corrosion-resistant metallic material such as titanium, nickel, platinum, molybdenum, tungsten or the like, or a stack resulting from stacking ITO, FTO or the like onto the above-described transparent substrate 6, or a conductive oxide such as ITO or FTO, carbon, or a conductive polymer.

The catalyst layer comprises, for instance platinum, a carbon-based material, a conductive polymer or the like.

The thickness of the counter electrode 2 may be appropriately set, for instance within a range from 0.005 to 0.5 mm, so that the counter electrode 2 has flexibility.

In a case where, for instance, the counter electrode substrate is a metallic material, a thickness of the counter electrode substrate that can impart flexibility to the counter electrode 2 is ordinarily 500 μm or less, preferably 200 μm or less. The lower limit of thickness may be a value with which occurrence of pinholes is sufficiently low, and varies depending on the foil production method and on the type of metal. In a case where, for instance, rolled titanium foil is used as the counter electrode substrate, it is ordinarily sufficient for the thickness of the counter electrode substrate to be 20 μm or greater, but the thickness is not limited thereto if there is used a thin foil with sufficiently low occurrence of pinholes.

[Inorganic Sealing Section Formation Step]

Figure 7:
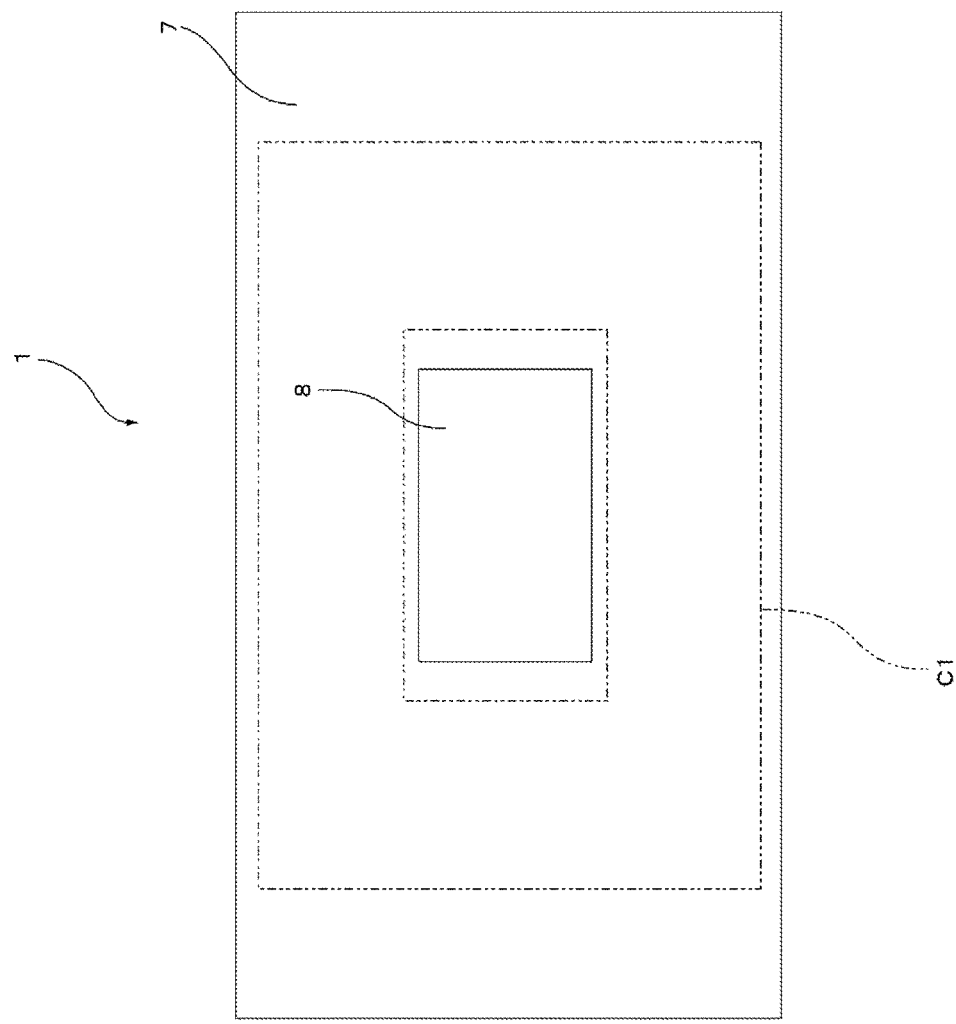
FIG. 7 is a plan-view diagram illustrating a working electrode of FIG. 5.
Figure 8:
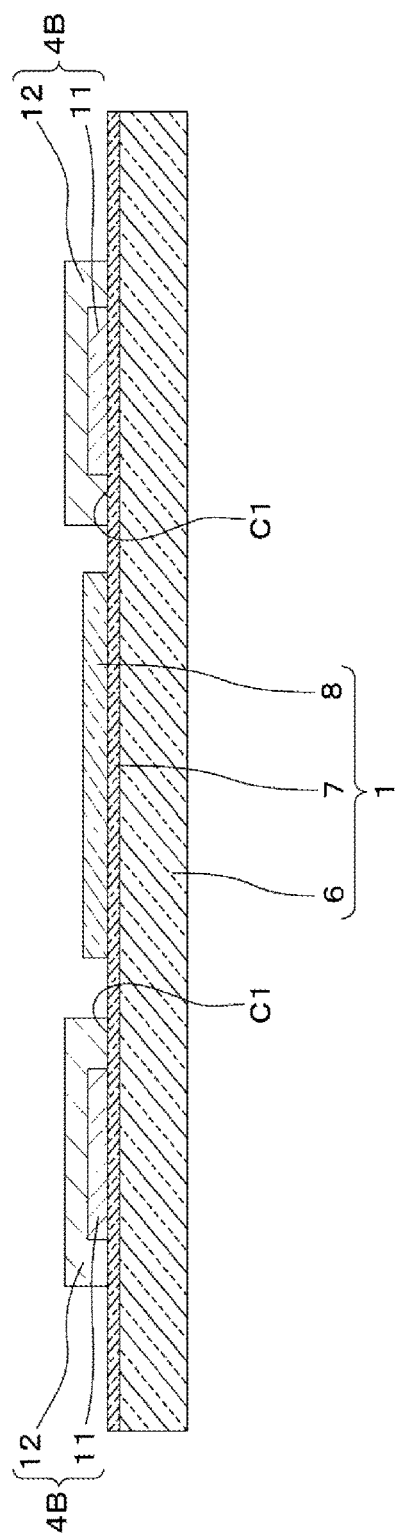
FIG. 8 is a cross-sectional diagram illustrating an inorganic sealing section formation step in a production process of the dye-sensitized solar cell of FIG. 1.

Next, as illustrated in FIG. 7 and FIG. 8, the inorganic sealing section 4B is formed at the first annular site C1, which is a site on the surface of the transparent conductive film 7 of the working electrode 1, and that surrounds the porous oxide semiconductor layer 8. Specifically, the inorganic sealing section 4B can be obtained by forming the collector wiring 11 at the first annular site C1 of the transparent conductive film 7, and by covering thereafter the collector wiring 11 with the wiring protective layer 12.

Herein, the collector wiring 11 can be obtained by applying, and then firing, a paste that comprises a metallic material such as silver or the like. The wiring protective layer 12 can be obtained by coating the collector wiring 11 with a paste that comprises an inorganic insulating material such as lead-free transparent low-melting point glass frit or the like, followed by firing.

[Resin Sealing Section Formation Step]

Figure 9:
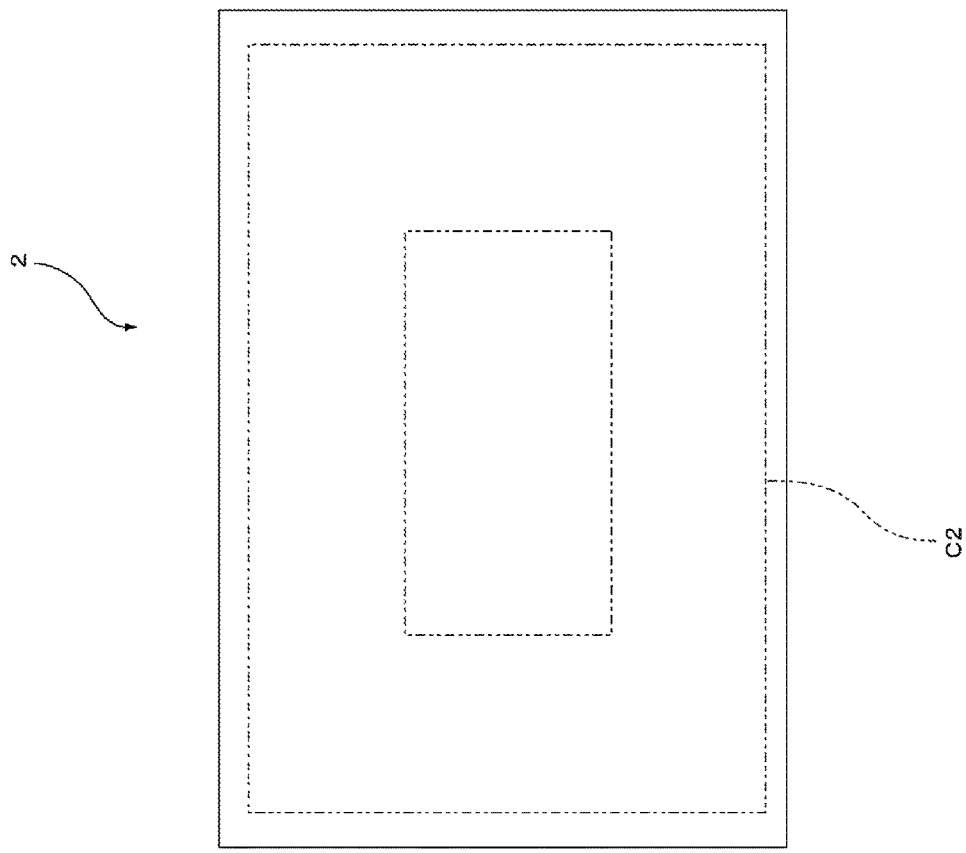
FIG. 9 is a plan-view diagram illustrating a counter electrode of FIG. 6.
Figure 10:
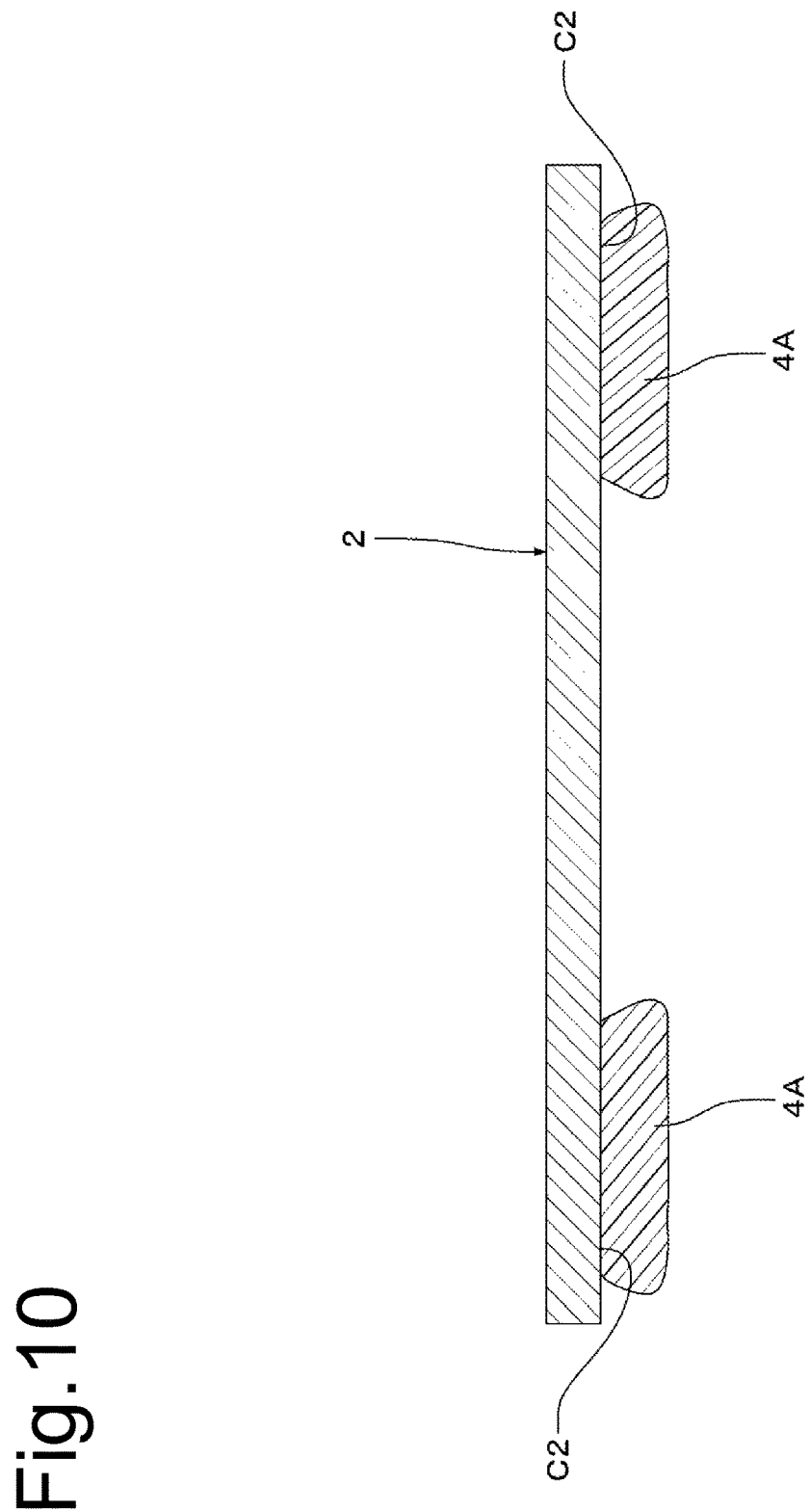
FIG. 10 is a cross-sectional diagram illustrating a resin sealing section formation step in the production process of the dye-sensitized solar cell of FIG. 1.

The resin sealing section 4A is formed at the second annular site C2, being a site on the surface of the counter electrode 2, as illustrated in FIG. 9 and FIG. 10. Examples of the resin that makes up the resin sealing section 4A include, for instance, thermoplastic resins such as ionomers, ethylene-vinyl acetic anhydride copolymers, ethylene-methacrylic acid copolymers, ethylene-vinyl alcohol copolymers or the like, as well as UV-cured resins, vinyl alcohol polymers and the like. In a case where the resin sealing section 4A comprises a thermoplastic resin, the resin sealing section 4A can be obtained by preparing an annular sheet comprising a thermoplastic resin, disposing the sheet at the second annular site C2, and heat-melting the sheet. In a case where the resin sealing section 4A is a UV-cured resin, the resin sealing section 4A can be obtained by coating the second annular site C2 of the counter electrode 2 with an ultraviolet-curable resin that is a precursor of the UV-cured resin.

[Dye Supporting Step]

A photosensitizing dye is caused next to be supported on the porous oxide semiconductor layer 8 of the working electrode 1. To this end, the working electrode 1 may be dipped in a solution that contains the photosensitizing dye, and, after the dye has adsorbed onto the porous oxide semiconductor layer 8, excess dye may be washed off using the solvent component of the above-described solution, and the whole may be dried, to cause thereby the photosensitizing dye to adsorb onto the porous oxide semiconductor layer 8. The photosensitizing dye may be caused to be supported on the porous oxide semiconductor layer 8 by coating the porous oxide semiconductor layer 8 with a solution containing the photosensitizing dye, followed by drying, to cause thereby the photosensitizing dye to be adsorbed onto the oxide semiconductor porous layer 8.

Examples of the photosensitizing dye include, for instance, ruthenium complexes having ligands that comprise bipyridine structures, terpyridine structures or the like; or organic dyes such as porphyrin, eosin, rhodamine or merocyanine.

[Electrolyte Layer Arrangement Step]

Figure 11:
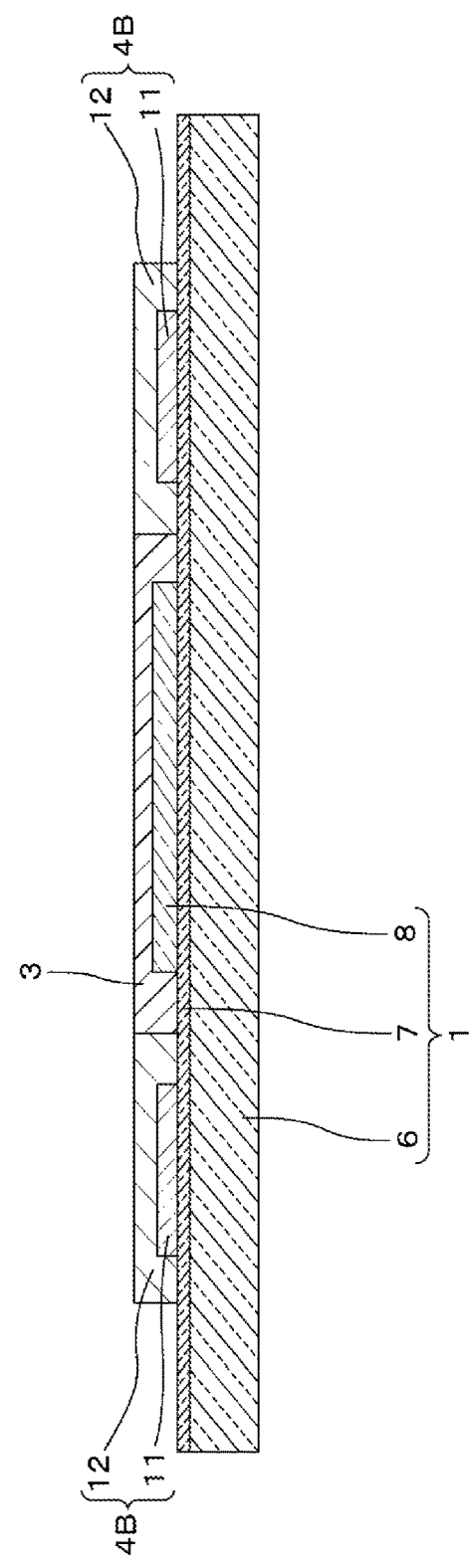
FIG. 11 is a cross-sectional diagram illustrating an electrolyte arrangement step in the production process of the dye-sensitized solar cell of FIG. 1.

Next, the electrolyte 3 is disposed on the working electrode 1, inside the inorganic sealing section 4B, as illustrated in FIG. 11. The electrolyte 3 can be obtained by pouring or printing inside the inorganic sealing section 4B, on the working electrode 1.

In a case where the electrolyte 3 is a liquid, the electrolyte 3 can be poured until overflowing beyond the inorganic sealing section 4B and to the outside. In this case, the electrolyte 3 can be poured in a sufficient amount inside the inorganic sealing section 4B. Upon formation of the sealing section 4 through bonding of the inorganic sealing section 4B and the resin sealing section 4A, thus, air can be sufficiently removed from the cell space S that is surrounded by the working electrode 1, the counter electrode 2 and the sealing section 4, and the photoelectric conversion efficiency can be sufficiently enhanced.

Ordinarily, the electrolyte 3 is made up of an electrolytic solution. The electrolytic solution comprises, for instance, an organic solvent and a redox couple such as $I^-/I_3^-$. As the organic solvent there can be used, for instance, acetonitrile, methoxyacetonitrile, methoxypropionitrile, propionitrile, ethylene carbonate, propylene carbonate, diethyl carbonate, γ-butyrolactone or the like. Examples of redox couples include, besides $I^-/I_3^-$, for instance, also bromine/bromide ions and the like. The dye-sensitized solar cell 100 is particularly effective in a case where the electrolyte used is an electrolytic solution that comprises a redox couple in the form of a volatile solute such as $I^-/I_3^-$ or the like, and an organic solvent that does not volatilize readily at high temperature, such as for instance acetonitrile, methoxyacetonitrile, methoxypropionitrile or the like. That is because in this case, changes in the internal pressure of the cell space S on account of changes in the temperature of the environment that surrounds the dye-sensitized solar cell 100 are particularly large, and the electrolyte 3 leaks readily through the interface between the sealing section 4 and the counter electrode 2, and through the interface between the sealing section 4 and the working electrode 1. A gelling agent may be added to the above-mentioned volatile solvent. The electrolyte 3 may be configured in the form of an ionic liquid electrolyte that comprises a mixture of an ionic liquid and a volatile component. That is because, in this case as well, changes in the internal pressure of the cell space S on account of changes in the temperature of the environment that surrounds the dye-sensitized solar cell 100 are large. Examples of the ionic liquid that can be used include, for instance, a room-temperature molten salt that is in a molten state at about room temperature, for instance a known iodine salt such as a pyridinium salt, imidazolium salt, triazolium salt or the like. For instance, 1-ethyl-3-methylimidazolium-bis(trifluoromethylsulfonyl)imide can be appropriately used as the room-temperature molten salt. Examples of the volatile component include, for instance, the above-mentioned organic solvents, as well as 1-methyl-3-methylimidazolium iodide, LiI, $I_2$, 4-t-butylpyridine or the like. Furthermore, nanocomposite ion-gel electrolyte, which is a quasi-solid electrolyte obtained by mixing the above-mentioned ionic liquid electrolyte with $SiO_2$, $TiO_2$ or nanoparticles such as carbon nanotube to form a gel may also be used for electrolyte 3, and ionic liquid electrolyte may be used that is obtained by gelling using an organic gelling agent such as polyvinylidene fluoride, polyethylene oxide derivatives or amino acid derivatives.

[Stacking Step]

Figure 12:
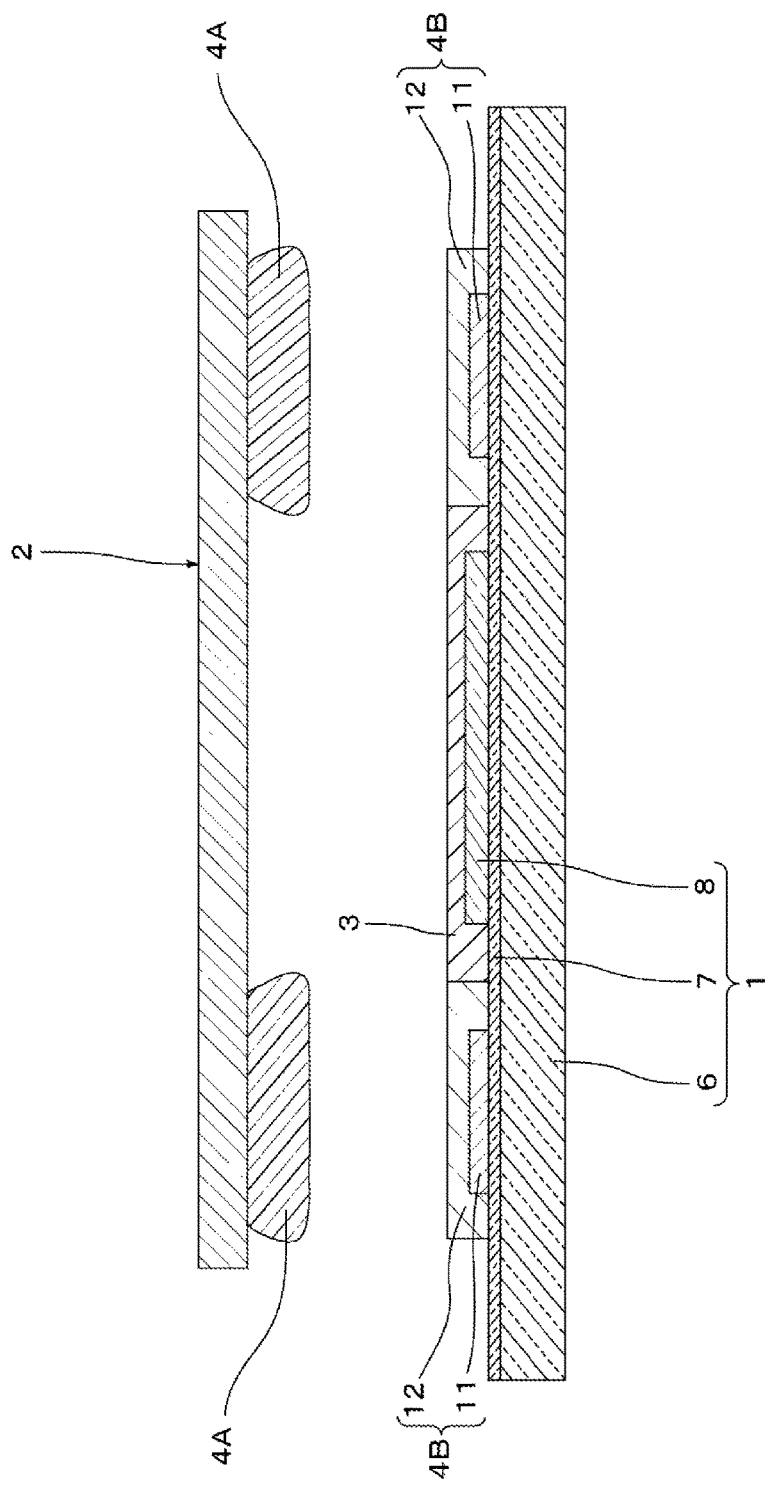
FIG. 12 is a cross-sectional diagram illustrating a superposition step in the production process of the dye-sensitized solar cell of FIG. 1.

Next, the working electrode 1 and the counter electrode 2 are disposed opposing each other, to superpose thereby the inorganic sealing section 4B and the resin sealing section 4A as illustrated in FIG. 12.

[Sealing Section Formation Step]

The resin sealing section 4A is bonded to the inorganic sealing section 4B and the counter electrode 2.

Figure 13:
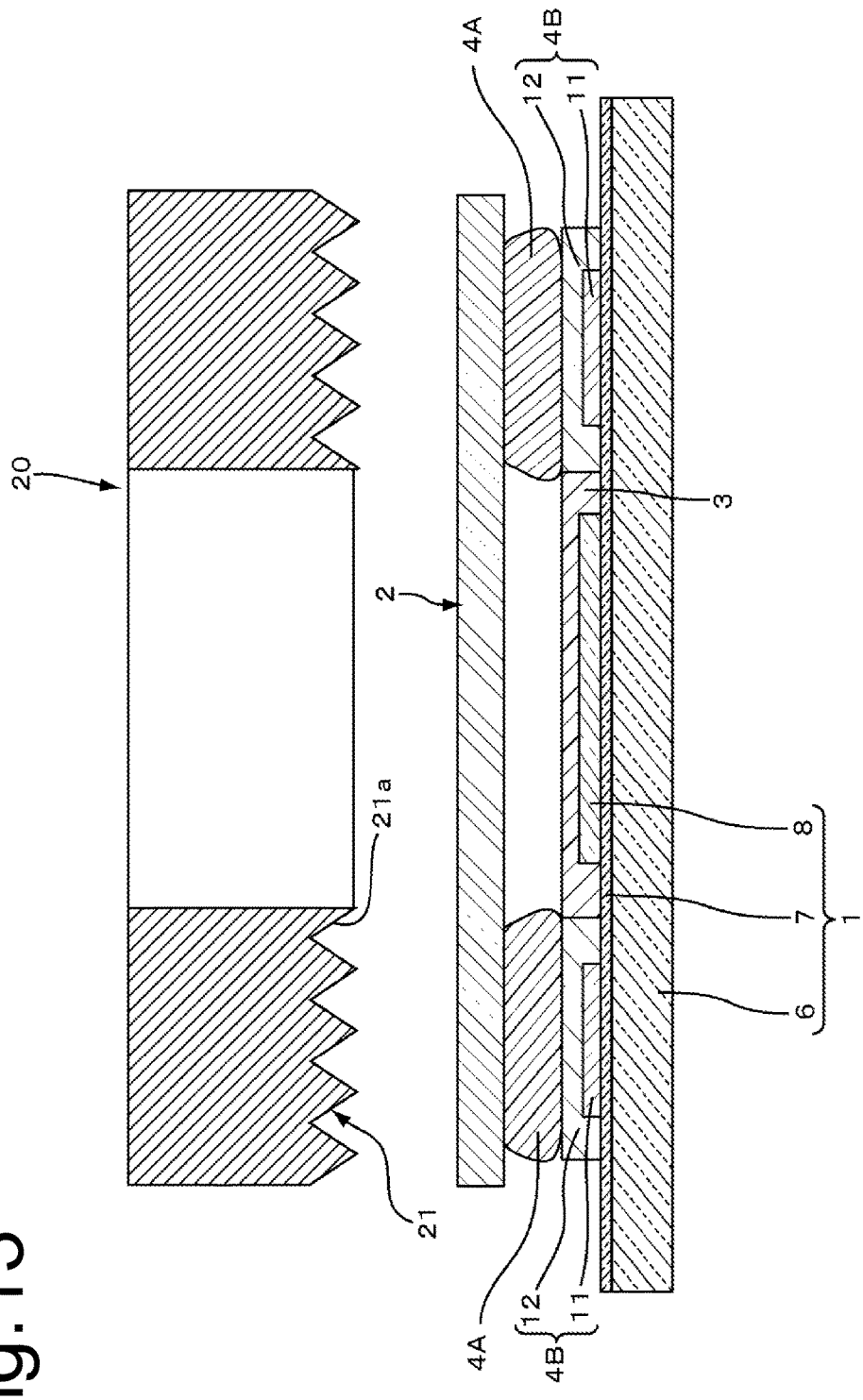
FIG. 13 is a cross-sectional diagram illustrating a sealing section formation step in the production process of the dye-sensitized solar cell of FIG. 1.

In a case where the resin that makes up the resin sealing section 4A is, for instance, a thermoplastic resin, the resin sealing section 4A is caused to melt while being pressed. Specifically, the resin sealing section 4A is caused to melt through heating while being pressed, via the counter electrode 2, using a frame-shaped member 20, as illustrated in FIG. 13. As the frame-shaped member 20 there is used a member in which annular grooves 21a, of shape identical to that of the annular grooves 15 that are to be formed on the counter electrode 2, are formed on an annular pressing surface 21 of the frame-shaped member 20. Specifically, there is used a frame-shaped member 20 in which a plurality of annular grooves 21a is formed along the pressing surface 21. Preferably, the material of the frame-shaped member 20 has good thermal conductivity. Examples of such a material include, for instance, brass and copper. Since the counter electrode 2 has flexibility, a peripheral edge portion of the counter electrode 2 is deformed easily, to yield a zigzag structure, upon heating and pressing of the resin sealing section 4A using the frame-shaped member 20 that has such a pressing surface 21.

Namely, the plurality of annular grooves 15 is formed at the second annular site C2 of the counter electrode 2 along the direction away from the electrolyte 3. The plurality of annular grooves 15 is formed also on the surface of the counter electrode 2 on a side opposite to the second annular site C2. Herein, the annular grooves 15 extend so as to intersect with the direction away from the electrolyte 3. A plurality of annular protrusions is formed on the counter electrode 2 side of the resin sealing section 4A at the same time that the plurality of annular grooves 15 is formed on the second annular site C2 of the counter electrode 2.

The above-mentioned zigzag structure corresponds to the shape of the pressing surface 21 that is transferred via the counter electrode 2. Therefore, the shape of the pressing surface 21 is not necessarily transferred as-is, and ordinarily is a deformed shape based on the shape of the pressing surface 21. For instance, even if the annular grooves 21a of the pressing surface 21 have a regular shape with leading end angles of 60°, the groove shape with leading end angles of 60° is not transferred to the second annular site C2 of the counter electrode 2 as-is. In some cases, for instance, the second annular site C2 may have grooves shaped with a slightly greater leading end angle, for instance grooves with a leading end angle of about 63°. The leading end angle varies depending on the location and, hence grooves having a leading end angle of 62° or grooves having a leading end angle of 70° may also be formed at the second annular site C2. A curved surface, instead of grooves, may be formed in the pressing surface 21. In this case, a deformed shape based on the shape of the pressing surface 21 is formed at the second annular site C2. The increasing-thickness sections 14a and the decreasing-thickness sections 14b can be formed even in a case where either grooves or curved surfaces are formed in the pressing surface 21.

The working electrode 1 and the counter electrode 2 are thus bonded to each other, with the sealing section 4 being formed between the working electrode 1 and the counter electrode 2. Herein, the sealing section 4 comprises the resin sealing section 4A and the inorganic sealing section 4B, the resin sealing section 4A has the decreasing-thickness sections 14b at the outermost side, the increasing-thickness sections 14a and the decreasing-thickness sections 14b are disposed alternately toward a direction away from the electrolyte 3, and the resin sealing section has an increasing-thickness section 14a at the innermost side of the resin sealing section 4A. Bonding between the inorganic sealing section 4B and the resin sealing section 4A can be performed, for instance, under atmospheric pressure.

In this case, pressing of the inorganic sealing section 4B and the resin sealing section 4A is ordinarily carried out at 1 to 50 MPa, preferably 2 to 30 MPa and more preferably 3 to 20 MPa.

In a case where, for instance, a thermoplastic resin is used as the resin that makes up the resin sealing section 4A, the temperature at a time where the resin sealing section 4A is melted is equal to or higher than the melting point of the resin sealing section 4A.

The temperature at a time where the resin sealing section 4A is melted is preferably "melting point of the resin included in the resin sealing section 4A+200° C." or lower. The resin included in the resin sealing section 4A may decompose due to heat if the above-mentioned temperature exceeds "melting point of the resin included in the resin sealing section 4A+200° C."

If the resin sealing section 4A is a UV-cured resin, the resin sealing section 4A is bonded to the inorganic sealing section 4B and the counter electrode 2 through irradiation of ultraviolet rays while the resin sealing section 4A is being pressed. At this time, ultraviolet rays are irradiated onto the resin sealing section 4A, through a frame-shaped member of shape identical to that of the frame-shaped member 20, while the resin sealing section 4A is being pressed via the counter electrode 2, using the frame-shaped member. Glass or the like that lets ultraviolet rays through is used as the constituent material of the frame-shaped member. Since the counter electrode 2 has flexibility, a peripheral edge section of the counter electrode 2 is deformed easily, to yield a zigzag structure, upon pressing of the resin sealing section 4A using the frame-shaped member. That is, the plurality of annular grooves 15 is formed at the second annular site C2 of the counter electrode 2 along the direction away from the electrolyte 3. The plurality of annular grooves 15 is also formed on the surface of the counter electrode 2, on the side opposite to the second annular site C2 of the counter electrode 2. Herein, each of the annular grooves 15 extends so as to intersect with the direction away from the electrolyte 3. The plurality of annular protrusions is formed on the counter electrode 2 side of the resin sealing section 4A at the same time that the plurality of the annular grooves 15 is formed on the second annular site C2 of the counter electrode 2.

The dye-sensitized solar cell 100 is thus obtained, and the manufacture of the dye-sensitized solar cell 100 is complete.

Second Embodiment

Figure 14:
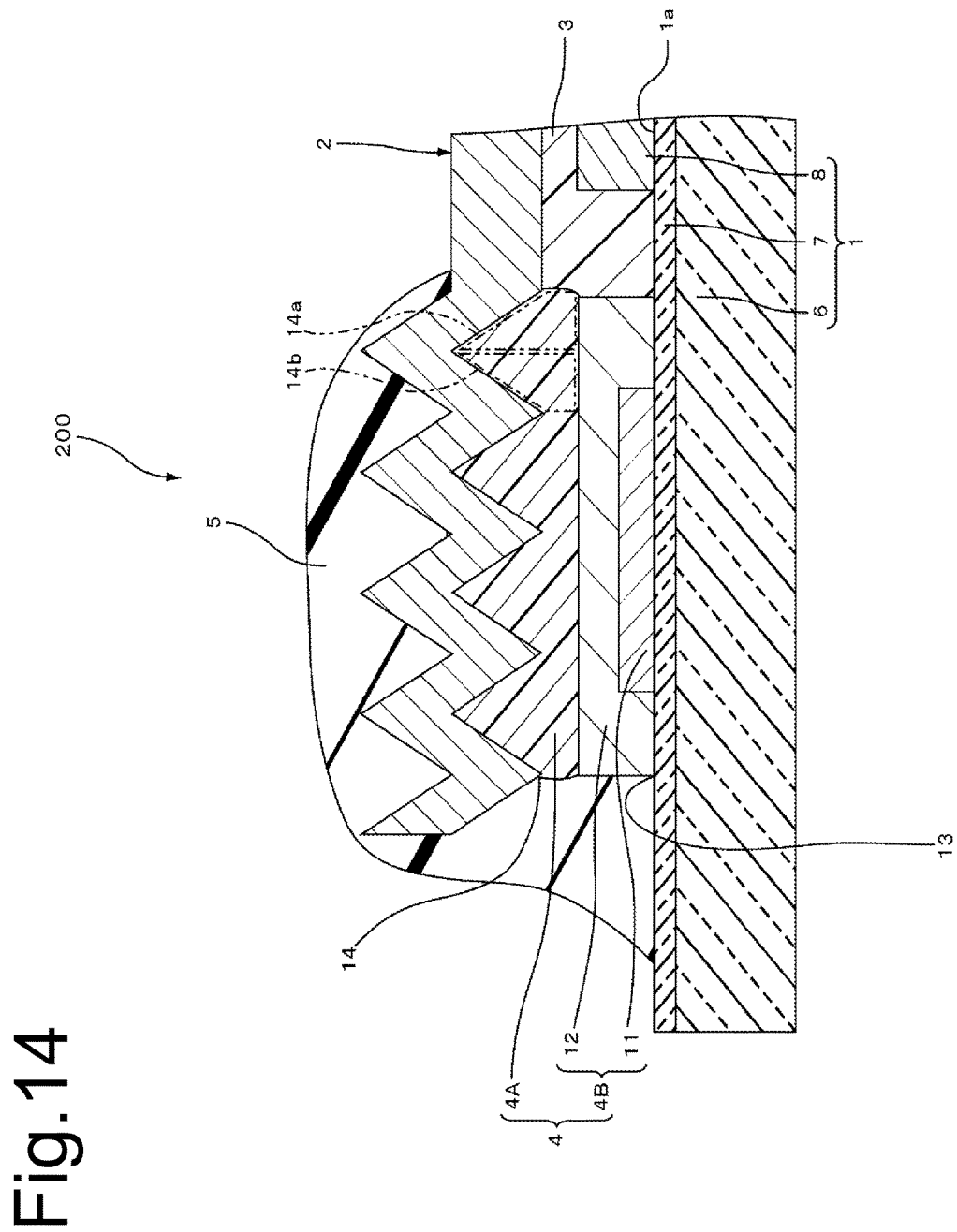
FIG. 14 is a partial enlarged cross-sectional diagram illustrating a second embodiment of the dye-sensitized solar cell of the present invention.

A second embodiment of the dye-sensitized solar cell according to the present invention will be explained first with reference to FIG. 14. FIG. 14 is a partial enlarged cross-sectional diagram illustrating a second embodiment of the dye-sensitized solar cell according to the present invention. In FIG. 14, constituent elements identical or similar to those of the first embodiment will be denoted with the same reference numerals as in the first embodiment, and a duplicate explanation thereof will be omitted.

As illustrated in FIG. 14, a dye-sensitized solar cell 200 of the present embodiment differs from the dye-sensitized solar cell 100 in the first embodiment in that the dye-sensitized solar cell 200 of the present embodiment further comprises a cover section 5 that covers a boundary 13 between the sealing section 4 and the working electrode 1, a boundary 14 between the sealing section 4 and the counter electrode 2, the outer peripheral face of the sealing section 4, and the surface, of the counter electrode 2, on the side opposite to the sealing section 4.

In this case, leakage of the electrolyte 3 or intrusion of external oxygen or moisture into the electrolyte 3 is suppressed not only by the sealing section 4, but also by the cover section 5. In particular, the cover section 5 effectively suppresses leakage of the electrolyte 3 or intrusion of external oxygen or moisture into the electrolyte 3 at the boundary 14 of the sealing section 4 and the counter electrode 2 and at the boundary 13 of the sealing section 4 and the working electrode 1. The cover section 5 covers also the surface of the counter electrode 2, on the side opposite to the sealing section 4. Consequently, leakage of the electrolyte 3 through the interface between the sealing section 4 and the counter electrode 2, and through the interface between the cover section 5 and the counter electrode 2, and intrusion of moisture or oxygen from the exterior through the interface between the sealing section 4 and the counter electrode 2 and through the interface between the cover section 5 and the counter electrode 2, are also suppressed. In particular, annular grooves are formed on the surface of the counter electrode 2, on the side opposite to the sealing section 4. Therefore, the passage distance of the electrolyte 3 and of moisture, oxygen and the like is longer than in a case where no annular grooves are formed on the counter electrode 2, on the side opposite to the sealing section 4. Therefore, interface leakage of the electrolyte 3 as well as intrusion of external moisture or oxygen can be suppressed more effectively.

The cover section 5 comprises a resin. As the resin there can be used an acid-modified polyolefin, a UV-cured resin, a polyvinyl alcohol, an epoxy resin or an ethylene-vinyl alcohol copolymer. In a case where acid-modified polyolefin or UV-cured resin is used as the resin, in particular, bonding between the cover section 5 and each of the working electrode 1, the counter electrode 2 and the sealing section 4 becomes stronger, and leakage of the electrolyte 3, as well as intrusion of external oxygen or moisture into the electrolyte 3 can be more sufficiently suppressed at the respective interfaces.

In addition to a resin, the cover section 5 may also comprise an inorganic material such as a metal, glass or the like. In this case, the cover section 5 may have the inorganic material dispersed in the resin, or the cover section 5 may be configured in the form of a stack of a resin layer comprising a resin and an inorganic material comprising an inorganic material.

Figure 15:
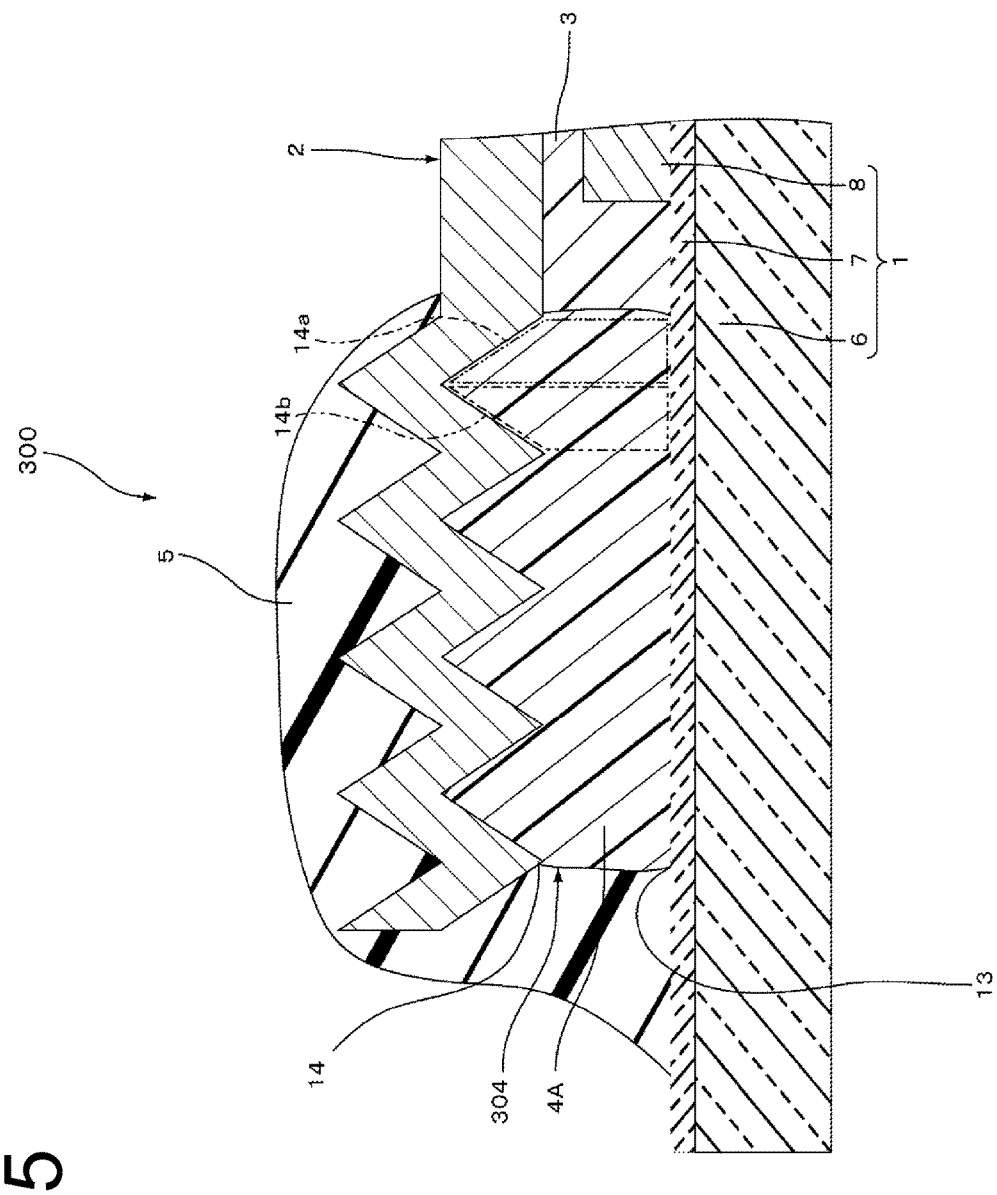
FIG. 15 is a partial enlarged cross-sectional diagram illustrating a third embodiment of the dye-sensitized solar cell of the present invention.

The present invention is not limited to the first and second embodiments. In the first and second embodiments, the sealing section 4 is made up of the resin sealing section 4A and the inorganic sealing section 4B, and the resin sealing section 4A is bonded only to the counter electrode 2. However, as a dye-sensitized solar cell 300 illustrated in FIG. 15, the sealing section 304 may comprise the resin sealing section 4A alone, and the resin sealing section 4A may be bonded to both the working electrode 1 and the counter electrode 2. That is, in the dye-sensitized solar cell 300, a sealing section 304 may not have the inorganic sealing section 4B. In this case, the thickness of the increasing-thickness sections 14a is the thickness of the sealing section 304 as-is. The thickness increases as a distance from the electrolyte 3 is increased.

In the first and second embodiments, the first annular site C1 of the working electrode 1 is a flat surface, but the first annular site C1 need not necessarily be a flat surface. For instance, one annular groove or a plurality of annular grooves 15 may be formed at the first annular site C1 in the same way as in the second annular site C2.

In the first and second embodiments, the increasing-thickness section 14a is in contact with the electrolyte 3, but the increasing-thickness section 14a need not be in contact with the electrolyte 3. That is, the sealing section 4 may have a portion the thickness whereof is constant and that is in contact with the electrolyte 3, or may have a decreasing-thickness section 14b, the thickness whereof decreases as a distance from the electrolyte 3 is increased, at the side closer to the electrolyte 3 side than does increasing-thickness section 14a. In other words, the increasing-thickness sections 14a may be at any position within the resin sealing section 4A. In that case, sufficient durability of the dye-sensitized solar cell can be secured, even when the dye-sensitized solar cell is used in a high-temperature environment. The reasons for this are as follows. Namely, if the resin sealing section 4A has the increasing-thickness sections 14a, then, by virtue of the increasing-thickness sections 14a, the thickness of the increasing-thickness sections 14a on the electrolyte 3 side becomes sufficiently small, the exposed surface area of the resin sealing section 4A to the electrolyte can be further reduced, and leakage of the electrolyte 3 can be sufficiently suppressed. Therefore, leakage of the electrolyte 3 can be sufficiently suppressed even when the dye-sensitized solar cell is used in a high-temperature environment. On the other hand, the thickness of the increasing-thickness sections 14a increases as a distance from the electrolyte 3 is increased. That is, there is a portion of large thickness on the side opposite to the electrolyte 3 (side not readily reached by the electrolyte 3). In other words, thickness can be secured at a position where the influence of the electrolyte 3 is small. Accordingly, the adhesive strength of the resin sealing section 4A to the counter electrode 2 is sufficiently enhanced by the increasing-thickness sections 14a. Therefore, drops in the adhesive strength of the resin sealing section 4A to the counter electrode 2 can be sufficiently suppressed, even when the dye-sensitized solar cell is used in a high-temperature environment.

In the first and second embodiments, the decreasing-thickness section 14b is provided on the outermost side of the resin sealing section 4A, but the decreasing-thickness section 14b need not be provided at the outermost side of the resin sealing section 4A. For instance, the increasing-thickness section 14a may be provided on the outermost side of the resin sealing section 4A. In other words, the decreasing-thickness sections 14b may be at any position within the resin sealing section 4A. In that case, sufficient durability of the dye-sensitized solar cell can be secured, even when the dye-sensitized solar cell is used in a high-humidity environment. The reasons for this are as follows. That is, if the resin sealing section 4A has the decreasing-thickness sections 14b, then, by virtue of the decreasing-thickness sections 14b, the thickness of the resin sealing section 4A, on the side of the decreasing-thickness sections 14b opposite to the electrolyte 3, becomes sufficiently small, the exposed surface area of the resin sealing section 4A to the outer atmosphere can be further reduced, and intrusion of moisture or air can be sufficiently suppressed. Therefore, intrusion of moisture or air can be sufficiently suppressed even when the dye-sensitized solar cell is used in a high-humidity environment. On the other side, the thickness of the decreasing-thickness sections 14b decreases as a distance from the electrolyte 3 is increased. That is, the thickness of the decreasing-thickness sections 14b increases towards the electrolyte 3. That is, there is a portion of large thickness on the electrolyte 3 side (side not readily reached by the moisture or air). In other words, thickness can be secured at a position where the influence of moisture or air is small. Accordingly, the adhesive strength of the resin sealing section 4A to the counter electrode 2 is sufficiently enhanced by the decreasing-thickness sections 14b. Therefore, drops in the adhesive strength of the resin sealing section 4A to the counter electrode 2 can be sufficiently suppressed, even when the dye-sensitized solar cell is used in a high-humidity environment.

In the first and second embodiments, the annular grooves 15 are formed not only at the second annular site C2 of the counter electrode 2, but also at the side, of the counter electrode 2, opposite to the second annular site C2. However, the annular grooves 15 need not necessarily be on the side, of the counter electrode 2, opposite to the second annular site C2. In a case where, for instance, the counter electrode 2 has no flexibility, the annular grooves 15 may be formed beforehand at the second annular site C2 of the counter electrode 2, before pressing of the resin sealing section 4A; herein, pressing of the resin sealing section 4A may be performed using a frame-shaped member having a flat pressing surface. In this case, it is necessary to form beforehand the increasing-thickness section opposing contact faces 2a of the counter electrode 2 and the decreasing-thickness section opposing contact faces 2b of the counter electrode 2, which are constituent elements of the second annular site C2 of the counter electrode 2. However, the increasing-thickness section opposing contact faces 2a and the decreasing-thickness section opposing contact faces 2b may be formed by cutting the surface of the counter electrode 2 using sand blasting, water blasting or the like.

Figure 16:
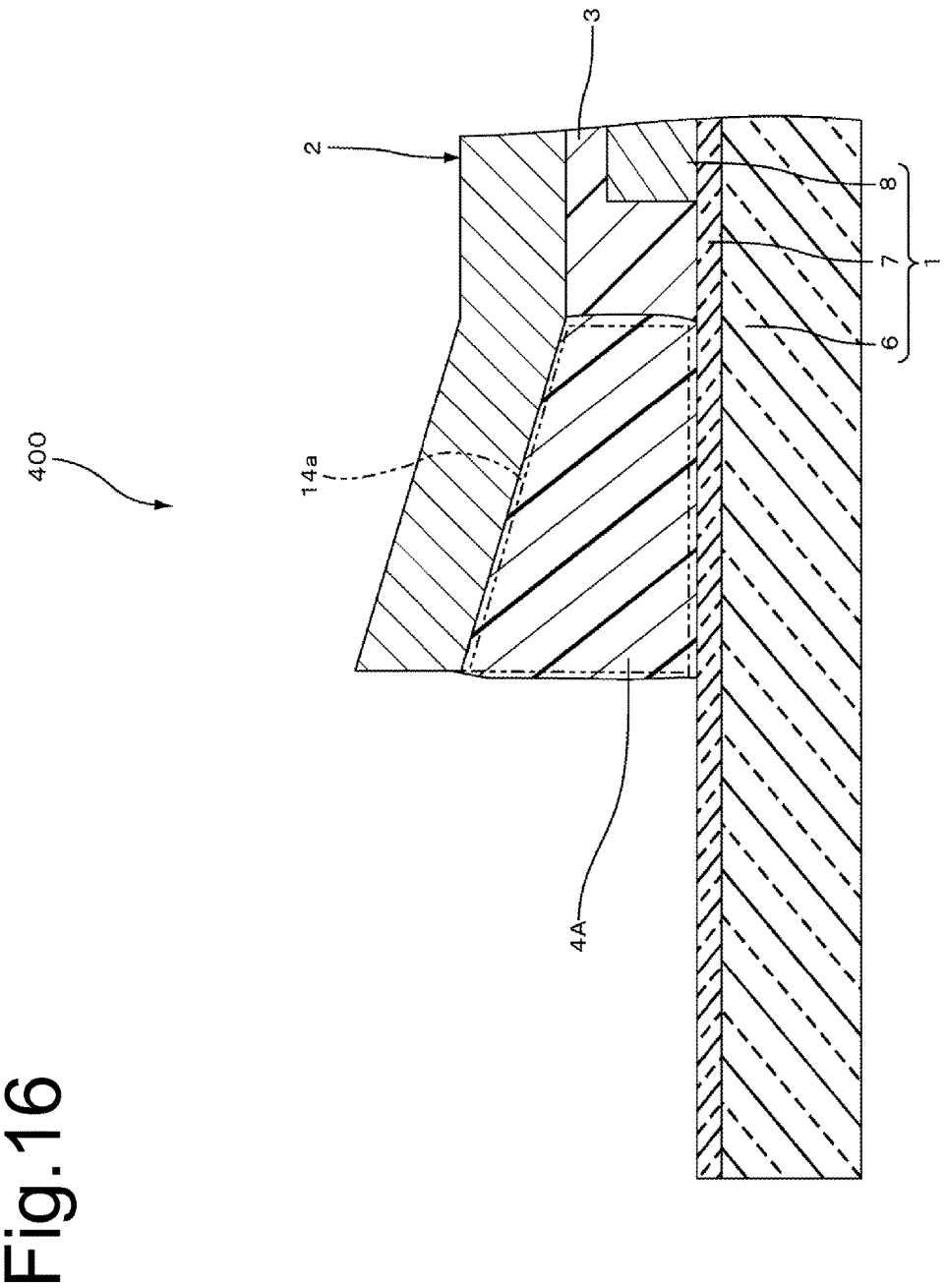
FIG. 16 is a partial enlarged cross-sectional diagram illustrating a fourth embodiment of the dye-sensitized solar cell of the present invention.

In the first and second embodiments, the resin sealing section 4A has the plurality of increasing-thickness sections 14a and the plurality of decreasing-thickness sections 14b, but the resin sealing section 4A may have just one increasing-thickness section 14a, as in the dye-sensitized solar cell 400 illustrated in FIG. 16, i.e. the resin sealing section 4A may not necessarily have the decreasing-thickness sections 14b.

Figure 17:
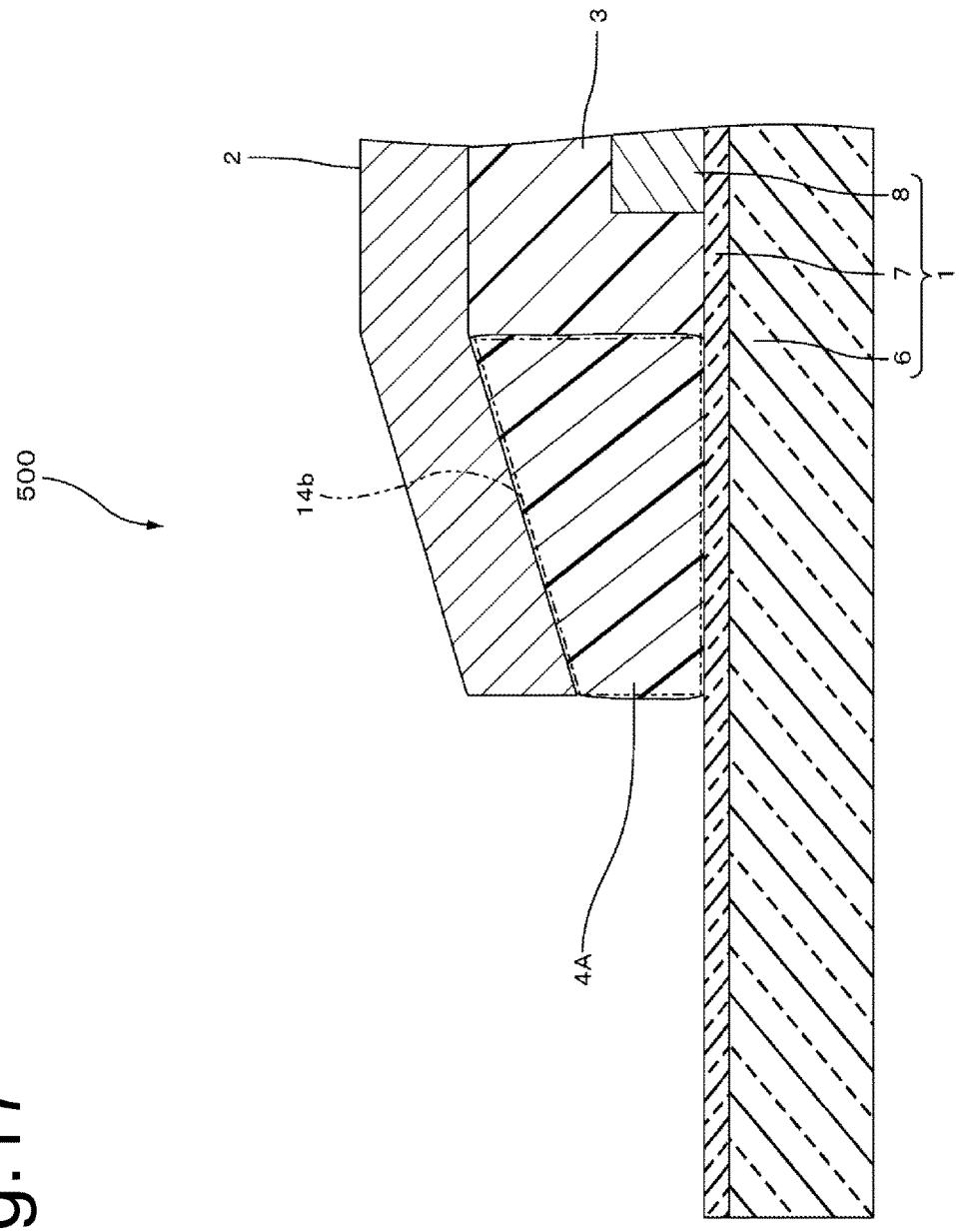
FIG. 17 is a partial enlarged cross-sectional diagram illustrating a fifth embodiment of the dye-sensitized solar cell of the present invention.

In the first and second embodiments, the resin sealing section 4A has the plurality of increasing-thickness sections 14a and the plurality of decreasing-thickness sections 14b, but the resin sealing section 4A may have just one decreasing-thickness section 14b, as in the dye-sensitized solar cell 500 illustrated in FIG. 17, i.e. the resin sealing section 4A may not necessarily have the increasing-thickness sections 14a.

In the first and second embodiments, the increasing-thickness section opposing contact faces 2a of the increasing-thickness sections 14a and the counter electrode 2, as well as the decreasing-thickness section opposing contact faces 2b of the decreasing-thickness sections 14b and the counter electrode 2, are flat surfaces. However, the increasing-thickness section opposing contact faces 2a and the decreasing-thickness section opposing contact faces 2b need not necessarily be flat surfaces, and may be curved surfaces, provided that the thickness of the increasing-thickness sections 14a increases, or the thickness of the decreasing-thickness sections 14b decreases as a distance from the electrolyte 3 is increased.

In the first and second embodiments, each of the annular increasing-thickness sections 14a and the annular decreasing-thickness sections 14b is formed continuously, but may be formed discontinuously.

In the first and second embodiments, not only the counter electrode 2, but also the working electrode 1 may have flexibility. Alternatively, the working electrode 1, instead of the counter electrode 2, may have flexibility.

EXAMPLES

The features of the present invention are explained more specifically by way of examples below, but the present invention is not limited to the examples.

Example 1

Firstly, a 10 cm×10 cm×4 mm FTO substrate was prepared. Next, a titanium oxide paste (Ti nanoxide T/sp, manufactured by Solaronix) was applied, using a doctor blade method, onto the FTO substrate, to a thickness of 10 µm. Thereafter, the whole was placed in a hot air circulation-type oven and was fired at 500° C. for 3 hours, to form a porous oxide semiconductor layer on the FTO substrate, and yield a 5 cm×5 cm working electrode.

On the other hand, a 6 cm×6 cm×2 mm counter electrode substrate comprising titanium was also prepared. A 10 nm-thick platinum catalyst layer (platinum catalyst film) was formed, by sputtering, on the counter electrode substrate, to yield a counter electrode.

The working electrode and the counter electrode were thus prepared.

A square annular resin sheet was prepared next by forming a 5 cm×5 cm×100 µm opening in the center of a 6 cm×6 cm×100 µm sheet that comprised Himilan (trade name, manufactured by DuPont-Mitsui Polychemicals), which is an ionomer. The resin sheet was disposed at an annular site that surrounded the porous oxide semiconductor layer of the working electrode. The resin sheet was melted through heating at 180° C. for 5 minutes; thereby, the resin sheet was bonded at the annular site, and a first resin sealing section was formed, at the annular site, on the FTO substrate.

Next, the working electrode was immersed for a whole day and night in a 0.2 mM dehydrated ethanol solution of a N719 dye, which is a photosensitizing dye, to cause the photosensitizing dye to be supported on the working electrode.

Meanwhile, a resin sheet which is the same as the above-described one was prepared, and was disposed at an annular site on the platinum catalyst layer of the counter electrode. The resin sheet was melted through heating at 180° C. for 5 minutes; thereby, the resin sheet was bonded at the annular site, and a second resin sealing section was formed, at the annular site, on the platinum catalyst layer of the counter electrode.

Next, the working electrode provided with the first resin sealing section was disposed in such a manner that the surface on the porous oxide semiconductor layer side of the FTO substrate was horizontal, and a volatile electrolyte having a volatile solvent that comprised methoxyacetonitrile as a main solvent, and comprising 0.1 M of lithium iodide, 0.05 M of iodine and 0.5 M of 4-tert-butylpyridine, was poured inside the first resin sealing section.

Next, the counter electrode provided with the second resin sealing section was disposed opposing the working electrode, and the first resin sealing section and the second resin sealing section were superposed on each other, under atmospheric pressure. A frame-shaped member made of brass and having the same size as the first resin sealing section, was heated, under atmospheric pressure, was disposed on the counter electrode, on the side opposite to the second resin sealing section, and the first resin sealing section and the second resin sealing section were melted through heating at 148° C. while being pressed at 5 MPa, using a press, to yield a sealing section comprising one increasing-thickness section. The frame-shaped member used herein had an annular pressing surface that constituted a cutout surface. Specifically, there was used a frame-shaped member that had been processed in such a manner that when the frame-shaped member was disposed on a flat surface, with the pressing surface facing the flat surface side, the innermost peripheral edge of the annular pressing surface came into contact with the flat surface, and the height from the flat surface at the outermost peripheral edge of the annular pressing surface was 5 µm, and in such a manner that the pressing surface yielded a flat surface. At this time, the increasing-thickness section was formed so that the minimum thickness was 10 µm and the difference between the maximum thickness and the minimum thickness was 5 µm. A dye-sensitized solar cell was thus obtained.

Example 2

A dye-sensitized solar cell was produced in the same way as in Example 1, but herein a decreasing-thickness section, the thickness whereof decreased as a distance from the electrolyte is increased, was further provided at the increasing-thickness section, on the side opposite to the electrolyte, the sealing section was formed in such a manner that the minimum thickness of the increasing-thickness section and the decreasing-thickness section was 20 µm, and the sealing section was formed using Nucrel (manufactured by DuPont-Mitsui Polychemicals), which is an ethylene-methacrylic acid copolymer, as the first and second resin sealing sections. As the frame-shaped member made of brass there was used a member having an annular pressing surface that was consisting of one V-shaped groove having a depth of 5 µm and a width of 50 µm.

Example 3

A dye-sensitized solar cell was produced in the same way as in Example 1, but herein the sealing section was formed in such a manner that the sealing section had two increasing-thickness sections and one decreasing-thickness section, the increasing-thickness sections and the decreasing-thickness section were alternately formed toward the direction away from the electrolyte, and the minimum thickness of increasing-thickness sections and the decreasing-thickness section was 20 µm. As the frame-shaped member made of brass there was used a member having an annular pressing surface that was consisting of one V-shaped groove having a depth of 5 µm and a width of 50 µm, and, outside the annular groove, one cutout surface formed along the annular groove.

Example 4

A dye-sensitized solar cell was produced in the same way as in Example 1, but herein the sealing section was formed in such a manner that the sealing portion had two increasing-thickness sections and two decreasing-thickness sections, the increasing-thickness sections and the decreasing-thickness sections were alternately formed toward the direction away from the electrolyte, and the minimum thickness of increasing-thickness sections and the decreasing-thickness sections was 20 μm. As the frame-shaped member made of brass there was used a member having an annular pressing surface that was consisting of two V-shaped grooves having each a depth of 5 μm and a width of 50 μm.

Example 5

A dye-sensitized solar cell was produced in the same way as in Example 1, but herein the sealing section was formed in such a manner that the sealing section had three increasing-thickness sections and three decreasing-thickness sections, the increasing-thickness sections and the decreasing-thickness sections were alternately formed toward the direction away from the electrolyte, and the minimum thickness of increasing-thickness sections and the decreasing-thickness sections was 20 μm, and the sealing section was formed using Nucrel (manufactured by DuPont-Mitsui Polychemicals), which is an ethylene-methacrylic acid copolymer, as the first resin sealing section and the second resin sealing section. As the frame-shaped member made of brass there was used a member having an annular pressing surface that was consisting of three V-shaped grooves having each a depth of 5 μm and a width of 50 μm.

Example 6

A dye-sensitized solar cell was produced in the same way as in Example 1, but herein the sealing section was formed in such a manner that the sealing section had five increasing-thickness sections and five decreasing-thickness sections, the increasing-thickness sections and the decreasing-thickness sections were alternately formed toward the direction away from the electrolyte, and the minimum thickness of the increasing-thickness sections and the decreasing-thickness sections was 20 μm, and the sealing section was formed using Bynel (manufactured by DuPont), which is an ethylene-vinyl acetic anhydride copolymer, as the first resin sealing section and the second resin sealing section. As the frame-shaped member made of brass there was used a member having an annular pressing surface that was consisting of five V-shaped grooves having each a depth of 5 μm and a width of 50 μm.

Example 7

A dye-sensitized solar cell was produced in the same way as in Example 1, but herein the sealing section was formed in such a manner that the sealing section had six increasing-thickness sections and five decreasing-thickness sections, the increasing-thickness sections and the decreasing-thickness sections were alternately formed toward the direction away from the electrolyte, and the minimum thickness of increasing-thickness sections and the decreasing-thickness sections was 20 μm, and the sealing section was formed using Bynel (manufactured by DuPont), which is an ethylene-vinyl acetic anhydride copolymer, as the first resin sealing section and the second resin sealing section. As the frame-shaped member made of brass there was used a member having an annular pressing surface that was consisting of five V-shaped grooves having each a depth of 5 μm and a width of 50 μm, outside the annular grooves, one cutout surface formed along the annular grooves.

Example 8

Firstly, a working electrode and a counter electrode were prepared in the same way as in Example 1.

Next, the working electrode was immersed for a whole day and night in a 0.2 mM dehydrated ethanol solution of a N719 dye, which is a photosensitizing dye, to cause the photosensitizing dye to be supported on the working electrode.

Next, 31x-101 (by ThreeBond), which is a UV-curable resin, was applied at an annular site that surrounded the porous oxide semiconductor layer of the working electrode, and was dried, to form thereby a first resin sealing section.

Next, 31x-101, which is a UV-curable resin, was coated onto an annular site on the platinum catalyst layer (platinum thin film) of the counter electrode, and was dried, to form thereby a second resin sealing section.

Next, the counter electrode provided with the second resin sealing section was disposed in such a manner that the surface of the platinum catalyst layer was horizontal, and a volatile electrolyte having a volatile solvent that comprised methoxyacetonitrile as a main solvent, and comprising 0.1 M of lithium iodide, 0.05 M of iodine and 0.5 M of 4-tert-butylpyridine, was poured inside the second resin sealing section.

Next, the working electrode provided with the first resin sealing section was disposed opposing the counter electrode, and the working electrode and the counter electrode were superposed on each other, under atmospheric pressure. A frame-shaped member made of glass and having the same size as that of the first resin sealing section, was disposed on the working electrode, on the side opposite to the first resin sealing section, under atmospheric pressure, and the first resin sealing section and the second resin sealing section were irradiated with ultraviolet rays, through the frame-shaped member, while the first resin sealing section and the second resin sealing section were pressed, at 5 MPa, using a press. A sealing section obtained by was thus formed through alternate arraying of eight increasing-thickness sections and eight decreasing-thickness sections, toward the direction away from the electrolyte, with an increasing-thickness section being disposed on the innermost side of the resin sealing section. As the frame-shaped member made of glass there was used a member having an annular pressing surface that was consisting of eight V-shaped grooves having each a depth of 5 μm and a width of 50 μm. The increasing-thickness sections and the decreasing-thickness sections were formed so that the minimum thickness was 20 μm and the difference between the maximum thickness and the minimum thickness was 5 μm. A dye-sensitized solar cell was thus obtained.

Example 9

A dye-sensitized solar cell was produced in the same way as in Example 1, but herein, after formation of the sealing section, a resin composition resulting from mixing glass into 31x-101, which is a UV-curable resin, was applied so as to cover the boundary between the sealing section and the working electrode, and the boundary between the sealing section and the counter electrode, and the resin composition was irradiated with ultraviolet rays, to form thereby a cover section.

Example 10

A dye-sensitized solar cell was produced in the same way as in Example 4, but herein, after formation of the sealing section, a resin composition resulting from mixing glass into 31x-101, which is a UV-curable resin, was applied so as to cover the boundary between the sealing section and the working electrode, and the boundary between the sealing section and the counter electrode, and the resin composition was irradiated with ultraviolet rays, to form thereby a cover section.

Example 11

A dye-sensitized solar cell was produced in the same way as in Example 1, but herein the cover section was formed as described below, after formation of the sealing section.

Firstly, a composite film was prepared by mixing glass into Nucrel (manufactured by DuPont-Mitsui Polychemicals), which is an acid-modified polyolefin. Next, the composite film was disposed so as to cover the boundary between the sealing section and the counter electrode, the boundary between the sealing section and the working electrode, the outer peripheral face of the counter electrode and part of the back face of the counter electrode, and so as to surround the sealing section, and a Teflon (registered trademark) film was then placed so as to cover the composite film. The composite film was heat-melted through the Teflon film, and the Teflon film was removed after natural cooling at room temperature. The cover section was thus formed.

Example 12

A dye-sensitized solar cell was produced in the same way as in Example 3, but herein the cover section was formed as described below, after formation of the sealing section.

Firstly, a composite film was formed by mixing glass into Bynel (manufactured by DuPont), which is an acid-modified polyolefin. Next, the composite film was disposed so as to cover the boundary between the sealing section and the counter electrode, the boundary between the sealing section and the working electrode, the outer peripheral face of the counter electrode and part of the back face of the counter electrode, and so as to surround the sealing section, and a Teflon film was then placed so as to cover the composite film. The composite film was heat-melted through the Teflon film, and the Teflon film was removed after natural cooling at room temperature. The cover section was thus formed.

Example 13

A dye-sensitized solar cell was produced in the same way as in Example 2, but herein the sealing section was formed using Himilan as the first and second resin sealing sections, and, thereafter, a cover section was formed as follows.

A laminate of butyl rubber and an aluminum sheet was prepared first. Next, the laminate was disposed, with the butyl rubber layer facing the sealing section side, so as to cover the boundary between the sealing section and the counter electrode, the boundary between the sealing section and the working electrode, the outer peripheral face of the counter electrode and part of the back face of the counter electrode, and so as to surround the sealing section, and a Teflon film was then placed so as to cover the laminate. The laminate was heat-melted through the Teflon film, and the Teflon film was removed after natural cooling at room temperature. The cover section was thus formed.

Example 14

A dye-sensitized solar cell was produced in the same way as in Example 1, but herein the sealing section was formed in such a manner that the sealing section had three increasing-thickness sections and two decreasing-thickness sections, the increasing-thickness sections and the decreasing-thickness sections were alternately formed toward the direction away from the electrolyte, and the minimum thickness of increasing-thickness sections and the decreasing-thickness sections was 40 µm, and the sealing section was formed using Bynel, which is an ethylene-vinyl acetic anhydride copolymer, as the first resin sealing section and the second resin sealing section, and, thereafter, a cover section was formed as follows.

A laminate of butyl rubber and an aluminum sheet was prepared first. Next, the laminate was disposed, with the butyl rubber layer facing the sealing section side, so as to cover the boundary between the sealing section and the counter electrode, the boundary between the sealing section and the working electrode, the outer peripheral face of the counter electrode and part of the back face of the counter electrode, and so as to surround the sealing section, and a Teflon film was then placed so as to cover the laminate. The laminate was heat-melted through the Teflon film, and the Teflon film was removed after natural cooling at room temperature. The cover section was thus formed.

Example 15

A dye-sensitized solar cell was produced in the same way as in Example 4, but herein the sealing section was formed using Bynel, which is an ethylene-vinyl acetic anhydride copolymer, as the first and second resin sealing sections, and in such a manner that the minimum thickness of the increasing-thickness sections and the decreasing-thickness sections was 60 µm, and, thereafter, a cover section was formed as follows.

Firstly, there was prepared Maxive (manufactured by Mitsubishi Gas Chemical), which is an epoxy resin composition. Next, the epoxy resin composition was applied so as to cover the boundary between the sealing section and the counter electrode, the boundary between the sealing section and the working electrode, the outer peripheral face of the counter electrode and part of the back face of the counter electrode, and so as to surround the sealing section. Thereafter, the epoxy resin composition was heat-cured. The cover section was thus formed.

Example 16

A dye-sensitized solar cell was produced in the same way as in Example 15, but herein the sealing section was formed in such a manner that the minimum thickness of the increasing-thickness sections and the decreasing-thickness sections was 30 µm, and the difference between the maximum thickness and the minimum thickness was 90 µm.

Example 17

A dye-sensitized solar cell was produced in the same way as in Example 15, but herein the sealing section was formed in such a manner that the minimum thickness of the increasing-thickness sections and the decreasing-thickness sections was 30 µm, and the difference between the maximum thickness and the minimum thickness was 95 µm.

Example 18

A dye-sensitized solar cell was produced in the same way as in Example 15, but herein the sealing section was formed in such a manner that the minimum thickness of the increasing-thickness sections and the decreasing-thickness sections was 100 µm, and the difference between the maximum thickness and the minimum thickness was 50 µm.

Example 19

A dye-sensitized solar cell was produced in the same way as in Example 8, but herein the sealing section was formed in such a manner that the sealing section had three increasing-thickness sections and three decreasing-thickness sections, the increasing-thickness sections and the decreasing-thickness sections were alternately formed toward the direction away from the electrolyte, and the minimum thickness of the increasing-thickness sections and the decreasing-thickness sections was 60 µm, and, thereafter, a cover section was formed as follows.

Firstly, there was prepared EP51FL-2 (manufactured by MASTER BOND), which is an epoxy resin composition. Next, the epoxy resin composition was applied so as to cover the boundary between the sealing section and the counter electrode, the boundary between the sealing section and the working electrode, the outer peripheral face of the counter electrode and part of the back face of the counter electrode, and so as to surround the sealing section. Thereafter, the epoxy resin composition was heat-cured. The cover section was thus formed.

Example 20

A dye-sensitized solar cell was produced in the same way as in Example 1, but herein the sealing section was formed in such a manner that the difference between the minimum thickness and the maximum thickness at the sealing section was 1 µm.

Example 21

A dye-sensitized solar cell was produced in the same way as in Example 3, but herein the sealing section was formed in such a manner that the difference between the minimum thickness and the maximum thickness at the sealing section was 1 µm.

Example 22

A dye-sensitized solar cell was produced in the same way as in Example 9, but herein the sealing section was formed in such a manner that the difference between the minimum thickness and the maximum thickness at the sealing section was 1 µm.

Example 23

A dye-sensitized solar cell was produced in the same way as in Example 11, but herein the sealing section was formed in such a manner that the sealing section had one increasing-thickness section and one decreasing-thickness section, the difference between the minimum thickness and the maximum thickness at the sealing section was 1 µm.

Example 24

A dye-sensitized solar cell was produced in the same way as in Example 1, but herein the sealing section was formed in such a manner that the sealing section had three increasing-thickness sections and three decreasing-thickness sections, the increasing-thickness sections and the decreasing-thickness sections were alternately formed toward the direction away from the electrolyte, the minimum thickness of the increasing-thickness sections and the decreasing-thickness sections was 40 µm, and the difference between minimum thickness and maximum thickness was 1 µm, and, thereafter, a cover section was formed as follows.

A laminate of butyl rubber and an aluminum sheet was prepared first. Next, the laminate was disposed, with the butyl rubber layer facing the sealing section side, so as to cover the boundary between the sealing section and the counter electrode, the boundary between the sealing section and the working electrode, the outer peripheral face of the counter electrode and part of the back face of the counter electrode, and so as to surround the sealing section, and a Teflon film was then placed so as to cover the laminate. The laminate was heat-melted through the Teflon film, and the Teflon film was removed after natural cooling at room temperature. The cover section was thus formed.

Example 25

A dye-sensitized solar cell was produced in the same way as in Example 1, but herein the sealing section was formed in such a manner that the sealing section had three increasing-thickness sections and three decreasing-thickness sections, the increasing-thickness sections and the decreasing-thickness sections were alternately formed toward the direction away from the electrolyte, the minimum thickness of the increasing-thickness sections and the decreasing-thickness sections was 40 µm, the difference between minimum thickness and maximum thickness was 1 µm, and, after forming the sealing section, a cover section was formed as follows.

Firstly, there was prepared EP008 (manufactured by Yoneyama Chemical), which is an epoxy resin composition. Next, the epoxy resin composition was applied so as to cover the boundary between the sealing section and the counter electrode, the boundary between the sealing section and the working electrode, the outer peripheral face of the counter electrode and part of the back face of the counter electrode, and so as to surround the sealing section. Thereafter, the epoxy resin composition was heat-cured. The cover section was thus formed.

Example 26

A dye-sensitized solar cell was produced in the same way as in Example 6, but herein there was used a 75 µm-thick counter electrode substrate wherein a FTO film was formed, by sputtering, on a PET film.

Example 27

A dye-sensitized solar cell was produced in the same way as in Example 6, but herein there was used a 75 µm-thick counter electrode substrate wherein a FTO film was formed, by sputtering, on a PEN film.

Example 28

A dye-sensitized solar cell was produced in the same way as in Example 1, but herein a decreasing-thickness section, the thickness whereof decreased as a distance from the electrolyte is increased, was further provided at the increasing-thickness section, on the side of the electrolyte, the sealing section was formed in such a manner that the minimum thickness of the decreasing-thickness section and the increasing-thickness section was 20 µm, and the sealing section was formed using Nucrel (manufactured by DuPont-Mitsui Polychemicals), which is an ethylene-methacrylic acid copolymer, as the first and second resin sealing sections. As the frame-shaped member made of brass there was used a member having an annular pressing surface that was consisting of one wedge-like protrusion having a height of 5 µm and a width of 50 µm.

Example 29

A dye-sensitized solar cell was produced in the same way as in Example 28, but herein the sealing section was formed in such a manner that the sealing section had one increasing-thickness section and two decreasing-thickness sections, the decreasing-thickness sections and the increasing-thickness section were alternately formed toward the direction away from the electrolyte. As the frame-shaped member made of brass there was used a member having a annular pressing surface that was consisting of one wedge-like protrusion having a depth of 5 µm and a width of 50 µm, and one cutout surface formed along the wedge-like protrusion, outside the wedge-like protrusion.

Comparative Example 1

A dye-sensitized solar cell was produced in the same way as in Example 1, but herein the sealing section was formed so that the minimum thickness was 5 µm and the difference between the minimum thickness and the maximum thickness was 0 µm. As the frame-shaped member made of brass there was used a frame-shaped member that had been processed in such a manner that when the frame-shaped member was disposed on a flat surface, with the pressing surface facing the flat surface side, both the innermost peripheral edge and the outermost peripheral edge of the annular pressing surface came into contact with the flat surface, and in such a manner that the pressing surface yielded a flat surface.

Comparative Example 2

A dye-sensitized solar cell was produced in the same way as in Example 8, but herein the sealing section was formed so that the minimum thickness was 20 µm and the difference between the minimum thickness and the maximum thickness was 0 µm. As the frame-shaped member made of glass there was used a frame-shaped member that had been processed in such a manner that when the frame-shaped member was disposed on a flat surface, with the pressing surface facing the flat surface side, both the innermost peripheral edge and the outermost peripheral edge of the annular pressing surface came into contact with the flat surface, and in such a manner that the pressing surface yielded a flat surface.

Comparative Example 3

A dye-sensitized solar cell was produced in the same way as in Example 2, but herein the sealing section was formed so that the minimum thickness was 40 µm and the difference between the minimum thickness and the maximum thickness was 0 µm. As the frame-shaped member made of brass there was used a frame-shaped member that had been processed in such a manner that when the frame-shaped member was disposed on a flat surface, with the pressing surface facing the flat surface side, both the innermost peripheral edge and the outermost peripheral edge of the annular pressing surface came into contact with the flat surface, and in such a manner that the pressing surface yielded a flat surface.

Comparative Example 4

A dye-sensitized solar cell was produced in the same way as in Example 6, but herein the sealing section was formed so that the minimum thickness was 60 µm and the difference between the minimum thickness and the maximum thickness was 0 µm. As the frame-shaped member made of brass there was used a frame-shaped member that had been processed in such a manner that when the frame-shaped member was disposed on a flat surface, with the pressing surface facing the flat surface side, both the innermost peripheral edge and the outermost peripheral edge of the annular pressing surface came into contact with the flat surface, and in such a manner that the pressing surface yielded a flat surface.

Example 30

Firstly, a 10 cm×10 cm×4 mm FTO substrate was prepared. Next, a titanium oxide paste (Ti nanoxide T/sp, manufactured by Solaronix) was applied, using a doctor blade method, onto the FTO substrate, to a thickness of 10 µm. Thereafter, the whole was placed in a hot air circulation-type oven and was fired at 500° C. for 3 hours, to form a porous oxide semiconductor layer on the FTO substrate, and yield a 5 cm×5 cm working electrode.

A 6 cm×6 cm×2 mm counter electrode substrate comprising titanium was prepared. A 10 nm-thick platinum catalyst layer was formed, by sputtering, on a counter electrode substrate, to yield a counter electrode.

The working electrode and the counter electrode were thus prepared.

A square annular resin sheet was prepared next by forming a 5 cm×5 cm×100 µm opening in the center of a 6 cm×6 cm×100 µm sheet that comprised Himilan (trade name, manufactured by DuPont-Mitsui Polychemicals), which is an ionomer. The resin sheet was disposed at an annular site that surrounded the porous oxide semiconductor layer of the working electrode. The resin sheet was melted through heating at 180° C. for 5 minutes; thereby, the resin sheet was bonded at the annular site, and a first resin sealing section was formed, at the annular site, on the FTO substrate.

Next, the working electrode was immersed for a whole day and night in a 0.2 mM dehydrated ethanol solution of a N719 dye, which is a photosensitizing dye, to cause the photosensitizing dye to be supported on the working electrode.

Meanwhile, a resin sheet like the above-described one was prepared, and was disposed at an annular site on the platinum catalyst layer of the counter electrode. The resin sheet was melted through heating at 180° C. for 5 minutes;

thereby, the resin sheet was bonded at the annular site, and a second resin sealing section was formed, at the annular site, on the platinum catalyst layer of the counter electrode.

Next, the working electrode provided with the first resin sealing section was disposed in such a manner that the surface on the porous oxide semiconductor layer side of the FTO substrate was horizontal, and a volatile electrolyte having a volatile solvent that comprised methoxyacetonitrile as a main solvent, and comprising 0.1 M of lithium iodide, 0.05 M of iodine and 0.5 M of 4-tert-butylpyridine, was poured inside the first resin sealing section.

Next, the counter electrode provided with the second resin sealing section was disposed opposing the working electrode, and the first resin sealing section and the second resin sealing section were superposed on each other, under atmospheric pressure. Under atmospheric pressure, a frame-shaped member made of brass and having the same size as that of the first resin sealing section was heated, and then disposed on the counter electrode, on the side opposite to the second resin sealing section, and the first resin sealing section and the second resin sealing section were melted through heating at 148° C. while being pressed at 5 MPa, using a press, to yield a sealing section comprising one decreasing-thickness section. The frame-shaped member used herein had an annular pressing surface that constituted a cutout surface. Specifically, there was used a frame-shaped member that had been processed in such a manner that when the frame-shaped member was disposed on a flat surface, with the pressing surface facing the flat surface side, the outermost peripheral edge of the annular pressing surface came into contact with the flat surface, and the height from the flat surface at the innermost peripheral edge of the annular pressing surface was 5 µm, and in such a manner that the pressing surface yielded a flat surface. The decreasing-thickness section was formed so that the minimum thickness was 10 µm and the difference between the maximum thickness and the minimum thickness was 5 µm. A dye-sensitized solar cell was thus obtained.

Example 31

A dye-sensitized solar cell was produced in the same way as in Example 30, but herein an increasing-thickness section, the thickness whereof increased as a distance from the electrolyte is increased, was further provided on the decreasing-thickness section, on the side of the electrolyte, the sealing section was formed in such a manner that the minimum thickness of the decreasing-thickness section and the increasing-thickness section was 20 µm, and the sealing section was formed using Nucrel (manufactured by DuPont-Mitsui Polychemicals), which is an ethylene-methacrylic acid copolymer, as the first and second resin sealing sections. As the frame-shaped member made of brass there was used a member having an annular pressing surface that was consisting of one V-shaped groove having a depth of 5 µm and a width of 50 µm.

Example 32

A dye-sensitized solar cell was produced in the same way as in Example 30, but herein the sealing section was formed in such a manner that the sealing section had two decreasing-thickness sections and one increasing-thickness section, the decreasing-thickness sections and the increasing-thickness section were formed alternately toward the direction of approaching the electrolyte, and the minimum thickness of the decreasing-thickness sections and the increasing-thickness section was 20 µm. As the frame-shaped member made of brass there was used a member having an annular pressing surface that was consisting of one V-shaped groove having a depth of 5 µm and a width of 50 µm, and inside the annular groove, one cutout surface formed along the annular groove.

Example 33

A dye-sensitized solar cell was produced in the same way as in Example 30, but herein the sealing section was formed in such a manner that the sealing section had two decreasing-thickness sections and two increasing-thickness sections, the decreasing-thickness sections and the increasing-thickness sections were alternately formed toward the direction of approaching the electrolyte, the minimum thickness of the decreasing-thickness sections and the increasing-thickness sections was 20 µm. As the frame-shaped member made of brass there was used a member having an annular pressing surface that was consisting of two V-shaped grooves having each a depth of 5 µm and a width of 50 µm.

Example 34

A dye-sensitized solar cell was produced in the same way as in Example 30, but herein the sealing section was formed in such a manner that the sealing section had three decreasing-thickness sections and three increasing-thickness sections, the decreasing-thickness sections and the increasing-thickness sections were alternately formed toward the direction of approaching the electrolyte, the minimum thickness of the decreasing-thickness sections and the increasing-thickness sections was 20 µm, and the sealing section was formed using Nucrel (manufactured by DuPont-Mitsui Polychemicals), which is an ethylene-methacrylic acid copolymer, as the first resin sealing section and the second resin sealing section. As the frame-shaped member made of brass there was used a member having an annular pressing surface that was consisting of three V-shaped grooves having each a depth of 5 µm and a width of 50 µm.

Example 35

A dye-sensitized solar cell was produced in the same way as in Example 30, but herein the sealing section was formed in such a manner that the sealing section had five decreasing-thickness sections and five increasing-thickness sections, the decreasing-thickness sections and the increasing-thickness sections were alternately formed toward the direction of approaching the electrolyte, the minimum thickness of the decreasing-thickness sections and the increasing-thickness sections was 20 µm, and the sealing section was formed using Bynel (manufactured by DuPont), which is an ethylene-vinyl acetic anhydride copolymer, as the first resin sealing section and the second resin sealing section. As the frame-shaped member made of brass there was used a member having an annular pressing surface that was consisting of five V-shaped grooves having each a depth of 5 µm and a width of 50 µm.

Example 36

A dye-sensitized solar cell was produced in the same way as in Example 30, but herein the sealing section was formed in such a manner that the sealing section had six decreasing-thickness sections and five increasing-thickness sections, the decreasing-thickness sections and the increasing-thickness sections were alternately formed toward the direction of approaching the electrolyte, the minimum thickness of the decreasing-thickness sections and the increasing-thickness sections was 20 µm, and the sealing section was formed using Bynel (manufactured by DuPont), which is an ethylene-vinyl acetic anhydride copolymer, as the first resin sealing section and the second resin sealing section. As the frame-shaped member made of brass there was used a member having an annular pressing surface that was consisting of five V-shaped grooves having each a depth of 5 µm and a width of 50 µm, and inside the annular grooves, one cutout surface formed along the annular grooves.

Example 37

Firstly, a working electrode and a counter electrode were prepared in the same way as in Example 30.
Next, the working electrode was immersed for a whole day and night in a 0.2 mM dehydrated ethanol solution of a N719 dye, which is a photosensitizing dye, to cause the photosensitizing dye to be supported on the working electrode.
Next, 31x-101 (manufactured by ThreeBond), which is a UV-curable resin, was applied at an annular site that surrounded the porous oxide semiconductor layer of the working electrode, and was dried, to form thereby a first resin sealing section.
Next, 31x-101, which is a UV-curable resin, was coated onto an annular site on the platinum catalyst layer of the counter electrode, and was dried, to form thereby a second resin sealing section.
Next, the counter electrode provided with the second resin sealing section was disposed in such a manner that the surface of the platinum catalyst layer was horizontal, and a volatile electrolyte having a volatile solvent that comprised methoxyacetonitrile as a main solvent, and comprising 0.1 M of lithium iodide, 0.05 M of iodine and 0.5 M of 4-tert-butylpyridine, was poured inside the second resin sealing section.
Next, the working electrode provided with the first resin sealing section was disposed opposing the counter electrode, and the working electrode and the counter electrode were superposed on each other, under atmospheric pressure. Under atmospheric pressure, a frame-shaped member made of brass and having the same size as that of the first resin sealing section, was disposed on the working electrode, on the side opposite to the first resin sealing section, and the first resin sealing section and the second resin sealing section were irradiated with ultraviolet rays, while the first resin sealing section and the second resin sealing section were pressed, at 5 MPa, using a press. A sealing section was formed through alternate arraying of eight decreasing-thickness sections and eight increasing-thickness sections, toward the direction of approaching the electrolyte, with a decreasing-thickness section being disposed on the outermost side of the resin sealing section. As the frame-shaped member made of brass there was used a member having an annular pressing surface that was consisting of eight V-shaped grooves having each a depth of 5 µm and a width of 50 µm. The decreasing-thickness sections and the increasing-thickness sections were formed so that the minimum thickness was 20 µm and the difference between the maximum thickness and the minimum thickness was 5 µm. A dye-sensitized solar cell was thus obtained.

Example 38

A dye-sensitized solar cell was produced in the same way as in Example 30, but herein, after formation of the sealing section, a resin composition resulting from mixing glass into 31x-101, which is a UV-curable resin, was applied so as to cover the boundary between the sealing section and the working electrode, and the boundary between the sealing section and the counter electrode, and the resin composition was irradiated with ultraviolet rays, to form thereby a cover section.

Example 39

A dye-sensitized solar cell was produced in the same way as in Example 33, but herein, after formation of the sealing section, a resin composition resulting from mixing glass into 31x-101, which is a UV-curable resin, was applied so as to cover the boundary between the sealing section and the working electrode, and the boundary between the sealing section and the counter electrode, and the resin composition was irradiated with ultraviolet rays, to form thereby a cover section.

Example 40

A dye-sensitized solar cell was produced in the same way as in Example 30, but herein the cover section was formed as described below, after formation of the sealing section.
Firstly, a composite film was prepared by mixing glass into Nucrel (manufactured by DuPont-Mitsui Polychemicals), which is an acid-modified polyolefin. Next, the composite film was disposed so as to cover the boundary between the sealing section and the counter electrode, the boundary between the sealing section and the working electrode, the outer peripheral face of the counter electrode and part of the back face of the counter electrode, and so as to surround the sealing section, and a Teflon film was then placed so as to cover the composite film. The composite film was heat-melted through the Teflon film, and the Teflon film was removed after natural cooling at room temperature. The cover section was thus formed.

Example 41

A dye-sensitized solar cell was produced in the same way as in Example 32, but herein the cover section was formed as described below, after formation of the sealing section.
Firstly, a composite film was formed by mixing glass into Bynel (manufactured by DuPont), which is an acid-modified polyolefin. Next, the composite film was disposed so as to cover the boundary between the sealing section and the counter electrode, the boundary between the sealing section and the working electrode, the outer peripheral face of the counter electrode and part of the back face of counter electrode, and so as to surround the sealing section, and a Teflon film was then placed so as to cover the composite film. The composite film was heat-melted through the Teflon film, and the Teflon film was removed after natural cooling at room temperature. The cover section was thus formed.

Example 42

A dye-sensitized solar cell was produced in the same way as in Example 31, but herein the sealing section was formed using Himilan as the first and second resin sealing sections, and, thereafter, a cover section was formed as follows.
A laminate of butyl rubber and an aluminum sheet was prepared first. Next, the laminate was disposed, with the butyl rubber layer facing the sealing section side, so as to cover the boundary between the sealing section and the counter electrode, the boundary between the sealing section and the working electrode, the outer peripheral face of the counter electrode and part of the back face of counter electrode, and so as to surround the sealing section, and a Teflon film was then placed so as to cover the laminate. The laminate was heat-melted through the Teflon film, and the Teflon film was removed after natural cooling at room temperature. The cover section was thus formed.

Example 43

A dye-sensitized solar cell was produced in the same way as in Example 30, but herein the sealing section was formed in such a manner that the sealing section had three decreasing-thickness sections and two increasing-thickness sections, the increasing-thickness sections and the decreasing-thickness sections were alternately formed toward the direction of approaching the electrolyte, and the minimum thickness of the decreasing-thickness sections and the increasing-thickness sections was 40 µm, and the sealing section was formed using Bynel, which is an ethylene-vinyl acetic anhydride copolymer, as the first resin sealing section and the second resin sealing section, and, thereafter, a cover section was formed as follows.

A laminate of butyl rubber and an aluminum sheet was prepared first. Next, the laminate was disposed, with the butyl rubber layer facing the sealing section side, so as to cover the boundary between the sealing section and the counter electrode, the boundary between the sealing section and the working electrode, the outer peripheral face of the counter electrode and part of the back face of the counter electrode, and so as to surround the sealing section, and a Teflon film was then placed so as to cover the laminate. The laminate was heat-melted through the Teflon film, and the Teflon film was removed after natural cooling at room temperature. The cover section was thus formed.

Example 44

A dye-sensitized solar cell was produced in the same way as in Example 33, but herein the sealing section was formed in such a manner that the minimum thickness of the decreasing-thickness sections and the increasing-thickness sections was 60 µm, using Bynel, which is an ethylene-vinyl acetic anhydride copolymer, as the first and second resin sealing sections, and, thereafter, a cover section was formed as follows.

Firstly, there was prepared Maxive (manufactured by Mitsubishi Gas Chemical), which is an epoxy resin composition. Next, the epoxy resin composition was applied so as to cover the boundary between the sealing section and the counter electrode, the boundary between the sealing section and the working electrode, the outer peripheral face of the counter electrode and part of the back face of the counter electrode, and so as to surround the sealing section. Thereafter, the epoxy resin composition was heat-cured. The cover section was thus formed.

Example 45

A dye-sensitized solar cell was produced in the same way as in Example 44, but herein the sealing section was formed in such a manner that the minimum thickness of the decreasing-thickness sections and the increasing-thickness sections was 30 µm, and the difference between the maximum thickness and the minimum thickness was 90 µm.

Example 46

A dye-sensitized solar cell was produced in the same way as in Example 44, but herein the sealing section was formed in such a manner that the minimum thickness of the decreasing-thickness sections and the increasing-thickness sections was 30 µm, and the difference between the maximum thickness and the minimum thickness was 95 µm.

Example 47

A dye-sensitized solar cell was produced in the same way as in Example 44, but herein the sealing section was formed in such a manner that the minimum thickness of the decreasing-thickness sections and the increasing-thickness sections was 100 µm, and the difference between the maximum thickness and the minimum thickness was 50 µm.

Example 48

A dye-sensitized solar cell was produced in the same way as in Example 37, but herein the sealing section was formed in such a manner that the sealing section had three decreasing-thickness sections and three increasing-thickness sections, the decreasing-thickness sections and the increasing-thickness sections were alternately formed toward the direction of approaching the electrolyte, and the minimum thickness of the decreasing-thickness sections and the increasing-thickness sections was 60 µm, and, thereafter, a cover section was formed as follows.

Firstly, there was prepared EP51F1-2 (manufactured by MASTER BOND), which is an epoxy resin composition. Next, the epoxy resin composition was applied so as to cover the boundary between the sealing section and the counter electrode, the boundary between the sealing section and the working electrode, the outer peripheral face of the counter electrode and part of the back face of the counter electrode, and so as to surround the sealing section. Thereafter, the epoxy resin composition was heat-cured. The cover section was thus formed.

Example 49

A dye-sensitized solar cell was produced in the same way as in Example 30, but herein the sealing section was formed so that the difference between the minimum thickness and the maximum thickness at the sealing section was 1 µm.

Example 50

A dye-sensitized solar cell was produced in the same way as in Example 32, but herein the sealing section was formed so that the difference between the minimum thickness and the maximum thickness at the sealing section was 1 µm.

Example 51

A dye-sensitized solar cell was produced in the same way as in Example 38, but herein the sealing section was formed so that the difference between the minimum thickness and the maximum thickness at the sealing section was 1 µm.

Example 52

A dye-sensitized solar cell was produced in the same way as in Example 40, but herein the sealing section was formed in such a manner that the sealing section had one decreasing-thickness section and one increasing-thickness section, the decreasing-thickness section and the increasing-thickness section were alternately formed toward the direction of approaching the electrolyte, in such a manner that the difference between the minimum thickness and the maximum thickness at the sealing section was 1 µm.

Example 53

A dye-sensitized solar cell was produced in the same way as in Example 30, but herein the sealing section was formed in such a manner that the sealing section had three decreasing-thickness sections and three increasing-thickness sections, the decreasing-thickness sections and the increasing-thickness sections were alternately formed toward the direction of approaching the electrolyte, the minimum thickness of the decreasing-thickness sections and the increasing-thickness sections was 40 μm and the difference between the minimum thickness and the maximum thickness vas 1 μm, and, after formation of the sealing section, a cover section was formed as follows.

A laminate of butyl rubber and an aluminum sheet was prepared first. Next, the laminate was disposed, with the butyl rubber layer facing the sealing section side, so as to cover the boundary between the sealing section and the counter electrode, the boundary between the sealing section and the working electrode, the outer peripheral face of the counter electrode and part of the back face of the counter electrode, and so as to surround the sealing section, and a Teflon film was then placed so as to cover the laminate. The laminate was heat-melted through the Teflon film, and the Teflon film was removed after natural cooling at room temperature. The cover section was thus formed.

Example 54

A dye-sensitized solar cell was produced in the same way as in Example 30, but herein the sealing section was formed in such a manner that the sealing section had three decreasing-thickness sections and three increasing-thickness sections, the decreasing-thickness sections and the increasing-thickness sections were alternately formed toward the direction of approaching the electrolyte, the minimum thickness of the decreasing-thickness sections and the increasing-thickness sections was 40 μm and the difference between the minimum thickness and the maximum thickness was 1 μm, and, after formation of the sealing section, a cover section was formed as follows.

Firstly, there was prepared EP008 (manufactured by Yoneyama Chemical), which is an epoxy resin composition. Next, the epoxy resin composition was applied so as to cover the boundary between the sealing section and the counter electrode, the boundary between the sealing section and the working electrode, the outer peripheral face of the counter electrode and part of the back face of the counter electrode, and so as to surround the sealing section. Thereafter, the epoxy resin composition was heat-cured. The cover section was thus formed.

Example 55

A dye-sensitized solar cell was produced in the same way as in Example 35, but herein there was used a 75 μm-thick counter electrode substrate obtained by forming a FTO film on a PET film by sputtering.

Example 56

A dye-sensitized solar cell was produced in the same way as in Example 35, but herein there was used a 75 μm-thick counter electrode substrate obtained by forming a FTO film on a PEN film by sputtering.

Example 57

A dye-sensitized solar cell was produced in the same way as in Example 30, but herein an increasing-thickness section, the thickness whereof increased as a distance from the electrolyte is increased, was further provided at the decreasing-thickness section, on the side opposite to the electrolyte, the sealing section was formed in such a manner that the minimum thickness of the decreasing-thickness section and the increasing-thickness section was 20 μm, and the sealing section was formed using Nucrel (manufactured by DuPont-Mitsui Polychemicals), which is an ethylene-methacrylic acid copolymer, as the first and second resin sealing sections. As the frame-shaped member made of brass there was used a member having an annular pressing surface that was consisting of one wedge-like protrusion having a height of 5 μm and a width of 50 μm.

Example 58

A dye-sensitized solar cell was produced in the same way as in Example 57, but herein the sealing section was formed in such a manner that the sealing section had one decreasing-thickness section and two increasing-thickness sections, and that an increasing-thickness section, a decreasing-thickness section and an increasing-thickness section were formed sequentially toward the direction away from the electrolyte. As the frame-shaped member made of brass there was used a member having an annular pressing surface that was consisting of one V-shaped groove having a depth of 5 μm and a width of 50 μm, and, outside the V-shaped groove, one cutout surface formed along the V-shaped groove.

Comparative Example 5

A dye-sensitized solar cell was produced in the same way as in Example 30, but herein the sealing section was formed so that the minimum thickness was 5 μm and the difference between the minimum thickness and the maximum thickness was 0 μm. As the frame-shaped member made of brass there was used a frame-shaped member that had been processed in such a manner that when the frame-shaped member was disposed on a flat surface, with the pressing surface facing the flat surface side, both the innermost peripheral edge and the outermost peripheral edge of the annular pressing surface came into contact with the flat surface, and in such a manner that the pressing surface yielded a flat surface.

Comparative Example 6

A dye-sensitized solar cell was produced in the same way as in Example 37, but herein the sealing section was formed so that the difference between the minimum thickness and the maximum thickness was 0 μm. As the frame-shaped member made of glass there was used a frame-shaped member that had been processed in such a manner that when the frame-shaped member was disposed on a flat surface, with the pressing surface facing the flat surface side, both the innermost peripheral edge and the outermost peripheral edge of the annular pressing surface came into contact with the flat surface, and in such a manner that the pressing surface yielded a flat surface.

Comparative Example 7

A dye-sensitized solar cell was produced in the same way as in Example 31, but herein the sealing section was formed so that the minimum thickness was 40 μm and the difference between the minimum thickness and the maximum thickness was 0 μm. As the frame-shaped member made of brass there was used a frame-shaped member that had been processed in such a manner that when the frame-shaped member was disposed on a flat surface, with the pressing surface facing the flat surface side, both the innermost peripheral edge and the outermost peripheral edge of the annular pressing surface came into contact with the flat surface, and in such a manner that the pressing surface yielded a flat surface.

Comparative Example 8

A dye-sensitized solar cell was produced in the same way as in Example 35, but herein the sealing section was formed so that the minimum thickness was 60 μm and the difference between the minimum thickness and the maximum thickness was 0 μm. As the frame-shaped member made of brass there was used a frame-shaped member that had been processed in such a manner that when the frame-shaped member was disposed on a flat surface, with the pressing surface facing the flat surface side, both the innermost peripheral edge and the outermost peripheral edge of the annular pressing surface came into contact with the flat surface, and in such a manner that the pressing surface yielded a flat surface.

[Durability Evaluation of Dye-Sensitized Solar Cells in a High-Temperature/Atmospheric Pressure Environment: Evaluation 1]

The photoelectric conversion efficiency ($\eta_0$) of the dye-sensitized solar cells obtained in Examples 1 to 29 and Comparative examples 1 to 4 was measured. Next, there was measured the photoelectric conversion efficiency ($\eta$) of the dye-sensitized solar cells after having been left to stand for 1000 h in a high-temperature environment of 85° C., under atmospheric pressure. The retention rate of photoelectric conversion efficiency (photoelectric conversion retention rate) was calculated on the basis of the expression below:

Retention rate (%) of photoelectric conversion efficiency=$\eta/\eta_0 \times 100$.

The results are shown in Table 1 and Table 2.

[Durability Evaluation of Dye-Sensitized Solar Cells in a High-Temperature/Low-Pressure Environment: Evaluation 2]

The photoelectric conversion efficiency ($\eta$) of the dye-sensitized solar cells obtained in Examples 1 to 29 and Comparative examples 1 to 4 was measured after the dye-sensitized solar cells had been left to stand for 1000 h in a high-temperature environment of 85° C. and low pressure of 800 hPa. The retention rate of photoelectric conversion efficiency was measured in the same way as described above. The results are shown in Table 1 and Table 2.

[Durability Evaluation of Dye-Sensitized Solar Cells in a Room-Temperature/a High-Humidity/Atmospheric Pressure Environment: Evaluation 3]

The photoelectric conversion efficiency ($\eta_0$) of the dye-sensitized solar cells obtained in Examples 30 to 58 and Comparative examples 5 to 8 was measured. Next, there was measured the photoelectric conversion efficiency ($\eta$) of the dye-sensitized solar cells after having been left to stand for 1000 h in a high-humidity environment of 90% RH at 40° C., under atmospheric pressure. The retention rate of photoelectric conversion efficiency (photoelectric conversion retention rate) was calculated on the basis of the expression below:

Retention rate (%) of photoelectric conversion efficiency=$\eta/\eta_0 \times 100$.

The results are shown in Table 3 and Table 4.

[Durability Evaluation of Dye-Sensitized Solar Cells in a Room-Temperature/High-Humidity/Low-Pressure Environment: Evaluation 4]

There was measured the photoelectric conversion efficiency ($\eta$) of the dye-sensitized solar cells obtained in Examples 30 to 58 and Comparative examples 5 to 8 after the dye-sensitized solar cells had been left to stand for 1000 h in a high-humidity environment of 90% RH at 40° C., under a low pressure of 1500 hPa. The retention rate of photoelectric conversion efficiency was measured in the same way as described above. The results are given Table 3 and Table 4.

[Durability Evaluation of Dye-Sensitized Solar Cells in a High-Temperature/High-Humidity/Atmospheric Pressure Environment: Evaluation 5]

There was measured the photoelectric conversion efficiency ($\eta$) of the dye-sensitized solar cells obtained in Examples 1 to 58 and Comparative examples 1 to 8 after having been left to stand for 1000 h in a high-humidity environment of 85% RH at 85° C., under atmospheric pressure. The retention rate of photoelectric conversion efficiency was measured in the same way as described above. The results are shown in Tables 1 to 4.

The slash symbols "/" and "\" in the schematic diagrams of the increasing-thickness sections and decreasing-thickness sections in Tables 1 to 4 denote respectively the inclined face of the decreasing-thickness sections and the inclined face of the increasing-thickness sections. In Tables 1 to 4, the symbols ". ." indicate that at least one "/\" is omitted.

TABLE 1

| | First and second resin sealing sections | Maximum thickness-minimum thickness (μm) | Minimum thickness (μm) | Schematic diagram of increasing-thickness sections and decreasing-thickness sections (left: outer side, right: electrolyte side) | Number of increasing-thickness sections | Number of decreasing-thickness sections | Cover section | Evaluation 1 Photoelectric conversion retention rate after 1000 h at 85° C. under atmospheric pressure (%) | Evaluation 2 Photoelectric conversion retention rate after 1000 h at 85° C. under 800 hPa (%) | Evaluation 5 Photoelectric conversion retention rate after 1000 h at 85° C., 85% RH, under atmospheric pressure (%) |
|---|---|---|---|---|---|---|---|---|---|---|
| Example 1 | Himilan | 5 | 10 | \ | 1 | 0 | — | 85 | 76 | 64 |
| Example 2 | Nucrel | 5 | 20 | /\ | 1 | 1 | — | 88 | 79 | 82 |
| Example 3 | Himilan | 5 | 20 | \/\ | 2 | 1 | — | 89 | 82 | 84 |
| Example 4 | Himilan | 5 | 20 | /\/\ | 2 | 2 | — | 92 | 88 | 88 |
| Example 5 | Nucrel | 5 | 20 | /\../\ | 3 | 3 | — | 95 | 92 | 94 |
| Example 6 | Bynel | 5 | 20 | /\../\ | 5 | 5 | — | 96 | 94 | 96 |
| Example 7 | Bynel | 5 | 20 | \/\../\ | 6 | 5 | — | 99 | 96 | 98 |
| Example 8 | 31x-101 | 5 | 20 | /\../\ | 8 | 8 | — | 99 | 98 | 99 |
| Example 9 | Himilan | 5 | 10 | \ | 1 | 0 | UV-curable resin + glass | 94 | 88 | 72 |
| Example 10 | Himilan | 5 | 20 | /\/\ | 2 | 2 | UV-curable resin + glass | 100 | 99 | 88 |

TABLE 1-continued

| | First and second resin sealing sections | Maximum thickness-minimum thickness (μm) | Minimum thickness (μm) | Schematic diagram of increasing-thickness sections and decreasing-thickness sections (left: outer side, right: electrolyte side) | Number of increasing-thickness sections | Number of decreasing-thickness sections | Cover section | Evaluation 1 Photoelectric conversion retention rate after 1000 h at 85° C. under atmospheric pressure (%) | Evaluation 2 Photoelectric conversion retention rate after 1000 h at 85° C. under 800 hPa (%) | Evaluation 5 Photoelectric conversion retention rate after 1000 h at 85° C., 85% RH, under atmospheric pressure (%) |
|---|---|---|---|---|---|---|---|---|---|---|
| Example 11 | Himilan | 5 | 10 | \ | 1 | 0 | Acid-modified polyolefin + glass | 94 | 88 | 74 |
| Example 12 | Himilan | 5 | 20 | \/\ | 2 | 1 | Acid-modified polyolefin + glass | 100 | 98 | 92 |
| Example 13 | Himilan | 5 | 20 | /\ | 1 | 1 | Butyl rubber + aluminum sheet | 99 | 92 | 88 |
| Example 14 | Bynel | 5 | 40 | \/\../\ | 3 | 2 | Butyl rubber + aluminum sheet | 100 | 96 | 94 |
| Example 15 | Bynel | 5 | 60 | /\/\ | 2 | 2 | Epoxy resin | 98 | 92 | 82 |
| Example 16 | Bynel | 90 | 30 | /\/\ | 2 | 2 | Epoxy resin | 97 | 91 | 83 |

TABLE 2

| | First and second resin sealing sections | Maximum thickness-minimum thickness (μm) | Minimum thickness (μm) | Schematic diagram of increasing-thickness sections and decreasing-thickness sections (left: outer side, right: electrolyte side) | Number of increasing-thickness sections | Number of decreasing-thickness sections | Cover section | Evaluation 1 Photoelectric conversion retention rate after 1000 h at 85° C. under atmospheric pressure (%) | Evaluation 2 Photoelectric conversion retention rate after 1000 h at 85° C. under 800 hPa (%) | Evaluation 5 Photoelectric conversion retention rate after 1000 h at 85° C., 85% RH, under atmospheric pressure (%) |
|---|---|---|---|---|---|---|---|---|---|---|
| Example 17 | Bynel | 95 | 30 | /\/\ | 2 | 2 | Epoxy resin | 92 | 84 | 81 |
| Example 18 | Bynel | 50 | 100 | /\/\ | 2 | 2 | Epoxy resin | 93 | 89 | 82 |
| Example 19 | 31x-101 | 5 | 60 | /\../\ | 3 | 3 | Epoxy resin | 100 | 96 | 96 |
| Example 20 | Himilan | 1 | 10 | \ | 1 | 0 | — | 79 | 72 | 61 |
| Example 21 | Himilan | 1 | 20 | \/\ | 2 | 1 | — | 82 | 78 | 67 |
| Example 22 | Himilan | 1 | 10 | \ | 1 | 0 | UV-curable resin + glass | 88 | 84 | 68 |
| Example 23 | Himilan | 1 | 10 | /\ | 1 | 1 | Acid-modified polyolefin + glass | 92 | 86 | 72 |
| Example 24 | Himilan | 1 | 40 | /\../\ | 3 | 3 | Butyl rubber + aluminum sheet | 92 | 84 | 70 |
| Example 25 | Himilan | 1 | 40 | /\../\ | 3 | 3 | Epoxy resin | 94 | 92 | 92 |
| Example 26 | Bynel | 5 | 20 | /\../\ | 5 | 5 | — | 79 | 70 | 60 |
| Example 27 | Bynel | 5 | 20 | /\../\ | 5 | 5 | — | 78 | 71 | 60 |
| Example 28 | Nucrel | 5 | 20 | V | 1 | 1 | — | 87 | 78 | 81 |

TABLE 2-continued

| | First and second resin sealing sections | Maximum thickness-minimum thickness (μm) | Minimum thickness (μm) | Schematic diagram of increasing-thickness sections and decreasing-thickness sections (left: outer side, right: electrolyte side) | Number of increasing-thickness sections | Number of decreasing-thickness sections | Cover section | Evaluation 1 Photoelectric conversion retention rate after 1000 h at 85° C. under atmospheric pressure (%) | Evaluation 2 Photoelectric conversion retention rate after 1000 h at 85° C. under 800 hPa (%) | Evaluation 5 Photoelectric conversion retention rate after 1000 h at 85° C., 85% RH, under atmospheric pressure (%) |
|---|---|---|---|---|---|---|---|---|---|---|
| Example 29 | Nucrel | 5 | 20 | /\/ | 1 | 2 | — | 89 | 84 | 83 |
| Comp. ex. 1 | Himilan | 0 | 5 | — | 0 | 0 | — | 42 | 11 | 22 |
| Comp. ex. 2 | 31x-101 | 0 | 20 | — | 0 | 0 | — | 43 | 3 | 34 |
| Comp. ex. 3 | Nucrel | 0 | 40 | — | 0 | 0 | — | 44 | 15 | 21 |
| Comp. ex. 4 | Bynel | 0 | 60 | — | 0 | 0 | — | 48 | 16 | 22 |

TABLE 3

| | First and second resin sealing sections | Maximum thickness-minimum thickness (μm) | Minimum thickness (μm) | Schematic diagram of increasing-thickness sections and decreasing-thickness sections (left: outer side, right: electrolyte side) | Number of decreasing-thickness sections | Number of increasing-thickness sections | Cover section | Evaluation 3 Photoelectric conversion retention rate after 1000 h at 40° C., 90% RH, under atmospheric pressure (%) | Evaluation 4 Photoelectric conversion retention rate after 1000 h at 40° C., 90% RH, under 1500 hPa (%) | Evaluation 5 Photoelectric conversion retention rate after 1000 h at 85° C., 85% RH, under atmospheric pressure (%) |
|---|---|---|---|---|---|---|---|---|---|---|
| Example 30 | Himilan | 5 | 10 | / | 1 | 0 | — | 84 | 72 | 64 |
| Example 31 | Nucrel | 5 | 20 | /\ | 1 | 1 | — | 87 | 76 | 82 |
| Example 32 | Himilan | 5 | 20 | /\/ | 2 | 1 | — | 88 | 84 | 84 |
| Example 33 | Himilan | 5 | 20 | /\/\ | 2 | 2 | — | 91 | 88 | 88 |
| Example 34 | Nucrel | 5 | 20 | /\../\ | 3 | 3 | — | 94 | 92 | 94 |
| Example 35 | Bynel | 5 | 20 | /\../\ | 5 | 5 | — | 95 | 94 | 96 |
| Example 36 | Bynel | 5 | 20 | /\../\/ | 6 | 5 | — | 98 | 96 | 98 |
| Example 37 | 31x-101 | 5 | 20 | /\../\ | 8 | 8 | — | 98 | 98 | 99 |
| Example 38 | Himilan | 5 | 10 | / | 1 | 0 | UV-curable resin + glass | 93 | 84 | 72 |
| Example 39 | Himilan | 5 | 20 | /\/\ | 2 | 2 | UV-curable resin + glass | 99 | 98 | 88 |
| Example 40 | Himilan | 5 | 10 | / | 1 | 0 | Acid-modified polyolefin + glass | 93 | 86 | 74 |
| Example 41 | Himilan | 5 | 20 | /\/ | 2 | 1 | Acid-modified polyolefin + glass | 99 | 98 | 92 |
| Example 42 | Himilan | 5 | 20 | /\ | 1 | 1 | Butyl rubber + aluminum sheet | 98 | 93 | 88 |
| Example 43 | Bynel | 5 | 40 | /\/\ | 3 | 2 | Butyl rubber + aluminum sheet | 99 | 96 | 94 |

TABLE 3-continued

| | First and second resin sealing sections | Maximum thickness-minimum thickness (μm) | Minimum thickness (μm) | Schematic diagram of increasing-thickness sections and decreasing-thickness sections (left: outer side, right: electrolyte side) | Number of decreasing-thickness sections | Number of increasing-thickness sections | Cover section | Evaluation 3 Photoelectric conversion retention rate after 1000 h at 40° C., 90% RH, under atmospheric pressure (%) | Evaluation 4 Photoelectric conversion retention rate after 1000 h at 40° C., 90% RH, under 1500 hPa (%) | Evaluation 5 Photoelectric conversion retention rate after 1000 h at 85° C., 85% RH, under atmospheric pressure (%) |
|---|---|---|---|---|---|---|---|---|---|---|
| Example 44 | Bynel | 5 | 60 | /\/\ | 2 | 2 | Epoxy resin | 97 | 92 | 82 |
| Example 45 | Bynel | 90 | 30 | /\/\ | 2 | 2 | Epoxy resin | 97 | 91 | 83 |

TABLE 4

| | First and second resin sealing sections | Maximum thickness-minimum thickness (μm) | Minimum thickness (μm) | Schematic diagram of increasing-thickness sections and decreasing-thickness sections (left: outer side, right: electrolyte side) | Number of decreasing-thickness sections | Number of increasing-thickness sections | Cover section | Evaluation 3 Photoelectric conversion retention rate after 1000 h at 40° C., 90% RH, under atmospheric pressure (%) | Evaluation 4 Photoelectric conversion retention rate after 1000 h at 40° C., 90% RH, under 1500 hPa (%) | Evaluation 5 Photoelectric conversion retention rate after 1000 h at 85° C., 85% RH, under atmospheric pressure (%) |
|---|---|---|---|---|---|---|---|---|---|---|
| Example 46 | Bynel | 95 | 30 | /\/\ | 2 | 2 | Epoxy resin | 92 | 84 | 81 |
| Example 47 | Bynel | 50 | 100 | /\/\ | 2 | 2 | Epoxy resin | 93 | 89 | 82 |
| Example 48 | 31x-101 | 5 | 20 | /\../\ | 3 | 3 | Epoxy resin | 99 | 96 | 96 |
| Example 49 | Himilan | 1 | 10 | / | 1 | 0 | — | 78 | 68 | 61 |
| Example 50 | Himilan | 1 | 20 | /\/ | 2 | 1 | — | 81 | 78 | 67 |
| Example 51 | Himilan | 1 | 10 | / | 1 | 0 | UV-curable resin + glass | 87 | 80 | 68 |
| Example 52 | Himilan | 1 | 10 | /\ | 1 | 1 | Acid-modified polyolefin + glass | 91 | 84 | 72 |
| Example 53 | Himilan | 1 | 40 | /\../\ | 3 | 3 | Butyl rubber + aluminum sheet | 91 | 86 | 70 |
| Example 54 | Himilan | 1 | 40 | /\../\ | 3 | 3 | Epoxy resin | 93 | 92 | 92 |
| Example 55 | Bynel | 5 | 20 | /\../\ | 5 | 5 | — | 77 | 66 | 60 |
| Example 56 | Bynel | 5 | 20 | /\../\ | 5 | 5 | — | 78 | 67 | 60 |
| Example 57 | Nucrel | 5 | 20 | V | 1 | 1 | — | 86 | 75 | 81 |
| Example 58 | Nucrel | 5 | 20 | V\ | 1 | 2 | — | 88 | 85 | 83 |
| Comp. ex. 5 | Himilan | 0 | 5 | — | 0 | 0 | — | 41 | 15 | 22 |
| Comp. ex. 6 | 31x-101 | 0 | 20 | — | 0 | 0 | — | 42 | 22 | 34 |
| Comp. ex. 7 | Nucrel | 0 | 40 | — | 0 | 0 | — | 43 | 13 | 21 |
| Comp. ex. 8 | Bynel | 0 | 60 | — | 0 | 0 | — | 47 | 15 | 22 |

The results of Tables 1 and 2 show that in the dye-sensitized solar cells of Examples 1 to 29, the retention rate of photoelectric conversion efficiency in a high-temperature environment was higher than that of the dye-sensitized solar cells of Comparative examples 1 to 4. In a low-pressure environment, in particular, the dye-sensitized solar cells of Examples 1 to 29 exhibited yet higher retention rate of photoelectric conversion efficiency than the dye-sensitized solar cells of Comparative examples 1 to 4. The dye-sensitized solar cells of Examples 1 to 29 exhibited also a higher retention rate of photoelectric conversion efficiency than the dye-sensitized solar cells of Comparative examples 1 to 4, under a high-temperature and high-humidity environment. The results of Example 2, Example 28 and Example 29 showed that the retention rate of photoelectric conversion efficiency in a high-temperature environment was also high even when an increasing-thickness section of the resin sealing section was not in contact with the electrolyte.

The results of Table 3 and Table 4 show that in the dye-sensitized solar cells of Examples 30 to 58, the retention rate of photoelectric conversion efficiency in a high-humidity environment was higher than that of the dye-sensitized solar cells of Comparative examples 5 to 8. In a low-pressure environment, in particular, the dye-sensitized solar cells of Examples 30 to 58 exhibited yet higher retention rate of photoelectric conversion efficiency than the dye-sensitized solar cells of Comparative examples 5 to 8. The dye-sensitized solar cells of Examples 30 to 58 exhibited also a higher retention rate of photoelectric conversion efficiency than the dye-sensitized solar cells of Comparative examples 5 to 8, under a high-temperature and high-humidity environment. The results of Example 31, Example 57 and Example 58 showed that the retention rate of photoelectric conversion efficiency in a high-humidity environment was also high even when the resin sealing section had no decreasing-thickness section on the outermost side.

Accordingly, it was confirmed that a dye-sensitized solar cell of the present invention can secure sufficient durability, even when the dye-sensitized solar cell is used in a high-temperature environment or a high-humidity environment.

EXPLANATION OF THE REFERENCE NUMERALS 1 working electrode (electrode)
1a surface
2 counter electrode (electrode)
2a increasing-thickness section opposing contact face
2b decreasing-thickness section opposing contact face
3 electrolyte
4 sealing section
4A resin sealing section
4B inorganic sealing section
5 cover section
13 boundary between working electrode and sealing section
14 boundary between counter electrode and sealing section
14a increasing-thickness section (changing-thickness section)
14b decreasing-thickness section (changing-thickness section)
14c inclined face
14d inclined face
15 annular groove
16 conductive substrate
100, 200, 300, 400, 500 dye-sensitized solar cell
S cell space

The invention claimed is:

1. A dye-sensitized solar cell, comprising:
a pair of electrodes that oppose each other, the pair of electrodes including a first electrode and a second electrode, the first electrode of the pair of electrodes having a flexibility, the first electrode of the pair of electrodes including a substrate consisting of a metallic material having a first inclined surface and a second inclined surface, the first inclined surface and the second inclined surface of the first electrode meet and form a pointed vertex;
a porous oxide semiconductor layer provided between the pair of electrodes,
a photosensitizing dye supported on the porous oxide semiconductor,
a sealing member that joins the pair of electrodes; and
an electrolyte that fills a cell space, the cell space being surrounded by the pair of electrodes and the sealing member, wherein
the second electrode has a conductive substrate,
the sealing member consists of a resin sealing member and an inorganic sealing member,
the resin sealing member consists of a resin,
the resin sealing member is in direct contact with the electrolyte,
the inorganic sealing member joins the resin sealing member and the conductive substrate of the second electrode, the inorganic sealing member consisting of an inorganic material,
the inorganic sealing member is in direct physical contact with the second electrode and is not in direct physical contact with the first electrode,
an interface between the inorganic sealing member and the conductive substrate of the second electrode is a flat surface,
the resin sealing member has a changing-thickness section, a thickness of the changing-thickness section changing to increase or decrease as a distance from the electrolyte is increased and the changing-thickness section having an inclined face, the thickness is in a direction perpendicular to a flat surface of the second electrode of the pair of electrodes,
the inclined face of the changing-thickness section comes into contact with and opposes the first inclined surface of the first electrode of the pair of electrodes, and
the inclined face of the changing-thickness section of the resin sealing member is in contact with the first inclined surface of the first electrode.

2. The dye-sensitized solar cell according to claim 1, wherein the changing-thickness section is an increasing-thickness section, the thickness of the increasing thickness section increases as a distance from the electrolyte is increased.

3. The dye-sensitized solar cell according to claim 2, wherein
the inclined face of the changing-thickness section is a first inclined face, and
the resin sealing member further has a decreasing-thickness section, the thickness of the decreasing thickness section decreases as a distance from the electrolyte is increased and the decreasing thickness section has a second inclined face on a side opposite to the electrolyte with respect to the increasing-thickness section.

4. The dye-sensitized solar cell according to claim 3, wherein the resin sealing member has a second increasing-thickness section, the thickness of the second increasing thickness section increases as a distance from the electrolyte is increased and the second increasing thickness section has a third inclined face on the side opposite to the electrolyte with respect to the decreasing-thickness section.

5. The dye-sensitized solar cell according to claim 1, wherein
the changing thickness section of the resin sealing member has a plurality of increasing-thickness sections and a plurality of decreasing-thickness sections;
the plurality of increasing-thickness sections and the plurality of decreasing-thickness sections are arrayed alternately toward a direction away from the electrolyte, and one of the plurality of increasing-thickness sections is provided at a position closest to the electrolyte in the resin sealing member.

6. The dye-sensitized solar cell according to claim 2, wherein the increasing-thickness section is in contact with the electrolyte.

7. The dye-sensitized solar cell according to claim 1, wherein the changing-thickness section is a first decreasing-thickness section, a thickness of the first decreasing-thickness section first decreasing as a distance from the electrolyte is increased and the decreasing-thickness section having an inclined face.

8. The dye-sensitized solar cell according to claim 7,
wherein the first electrode of the pair of electrodes includes a third inclined surface, the third inclined surface being on a same side of the first electrode with respect to the first inclined surface,
wherein the resin sealing member further has a first increasing-thickness section, a thickness of the first increasing-thickness section increasing as a distance from the electrolyte is increased and the first increasing-thickness section having an inclined face is between the electrolyte and the first decreasing-thickness section, and
wherein the inclined face of the first decreasing-thickness section and the inclined face of the first increasing-thickness section come into contact with and oppose the first inclined surface and the third inclined surface of the first electrode of the pair of electrodes, respectively.

9. The dye-sensitized solar cell according to claim 8, wherein the resin sealing member further has a second decreasing-thickness section, a thickness of the second decreasing-thickness section decreasing as a distance from the electrolyte is increased and the second decreasing-thickness section having an inclined face on a side opposite to the electrolyte with respect to the first increasing-thickness section, and the inclined face of the resin sealing member comes into contact with and opposes the first inclined surface of the first electrode of the pair of electrodes.

10. The dye-sensitized solar cell according to claim 8, wherein
the resin sealing member has a plurality of decreasing-thickness sections including the first decreasing-thickness section and a plurality of increasing-thickness sections including the first increasing-thickness section; and
the plurality of decreasing-thickness sections and the plurality of increasing-thickness sections are alternately arrayed toward a direction of approaching the electrolyte.

11. The dye-sensitized solar cell according to claim 3, wherein a groove in the resin sealing member extends so as to intersect with a direction away from the electrolyte and the groove is formed by a face of contact between the increasing-thickness section and the first electrode, and a face of contact between the decreasing-thickness section and the first electrode.

12. The dye-sensitized solar cell according to claim 1, wherein a maximum thickness of the resin sealing member is 10 μm or greater.

13. The dye-sensitized solar cell according to claim 1, wherein both of the first electrode and the second electrode of the pair of electrodes have flexibility.

14. The dye-sensitized solar cell according to claim 1, wherein
the porous oxide semiconductor layer is provided on the conductive substrate;
an interface between the conductive substrate and the porous oxide semiconductor layer is a flat surface; and
a face of contact between the increasing-thickness section and the first electrode of the pair of electrodes is tilted with respect to the flat surface.

15. The dye-sensitized solar cell according to claim 1, further comprising a cover section that covers at least a boundary between the sealing member and the pair of electrodes at a side opposite to the electrolyte with respect to the sealing member, wherein
the cover section contains a resin.

16. The dye-sensitized solar cell according to claim 1, further comprising a cover section that covers at least a boundary between the sealing member and the pair of electrodes at an outer side to the sealing member, wherein
the cover section contains a resin and,
the cover section covers the second inclined surface of the first electrode.

17. The dye-sensitized solar cell according to claim 1, wherein the resin sealing member is in direct physical contact with the first electrode and is not in direct physical contact with the second electrode.

* * * * *